United States Patent [19]
Goto

[11] Patent Number: 5,539,346
[45] Date of Patent: Jul. 23, 1996

[54] FREQUENCY SYNTHESIZER HAVING DDS IN PLACE OF VCO

[75] Inventor: Tetsuo Goto, Hyogo-ken, Japan

[73] Assignee: Mitsubishi Denki Kabushiki Kaisha, Tokyo, Japan

[21] Appl. No.: 334,239

[22] Filed: Nov. 4, 1994

[30] Foreign Application Priority Data

Dec. 28, 1993 [JP] Japan ..................... 5-335989

[51] Int. Cl.$^6$ .............................. H03L 7/099; H03L 7/16
[52] U.S. Cl. ........................ 327/156; 327/159; 331/17; 331/25; 331/34
[58] Field of Search .................. 331/17, 25, 34; 327/156, 162, 159

[56] References Cited

U.S. PATENT DOCUMENTS

| | | | |
|---|---|---|---|
| 3,973,209 | 8/1976 | Nossen et al. | 328/14 |
| 4,151,473 | 4/1979 | Coleman et al. | 331/25 |
| 4,577,163 | 3/1986 | Culp | 331/1 A |
| 4,965,533 | 10/1990 | Gilmore | 331/18 |
| 5,184,092 | 2/1993 | Shahriary et al. | 331/17 |

FOREIGN PATENT DOCUMENTS

| | | |
|---|---|---|
| 0277726 | 8/1988 | European Pat. Off. . |
| 0492588 | 7/1992 | European Pat. Off. . |
| 3-38778 | 6/1991 | Japan . |

OTHER PUBLICATIONS

Stephen M. Walters et al., "Digital Phase-Locked Loop with Jitter Bounded", *IEEE Transactions On Circuits And Systems*, vol. 36, No. 7, Jul. 1989, N.Y., U.S., pp. 980–987, XP54027.

Primary Examiner—Siegfried H. Grimm
Attorney, Agent, or Firm—Rothwell, Figg, Ernst & Kurz

[57] ABSTRACT

A frequency synthesizer is able not only to keep a high frequency stability and follow a frequency of a reference signal that is set to cover or varies over a broad range, but also to provide stable phase-locked loop characteristics without a variable frequency oscillator being employed. In the frequency synthesizer, a phase-locked loop comprises phase comparator 1 for detecting a phase difference between reference signal A and comparison signal B to output phase error information; loop filter 2 for generating loop control information D in accordance with the phase error information C; and DDS 22 which generates the comparison signal B in accordance with the loop control information D which is a phase incremental value to take a required frequency out of waveform data corresponding to a phase by employing a clock signal from clock oscillator 32. Thus, synchronizing signal I which follows reference signal A, a frequency of which is set to cover or varies over a broad range can be obtained.

2 Claims, 23 Drawing Sheets

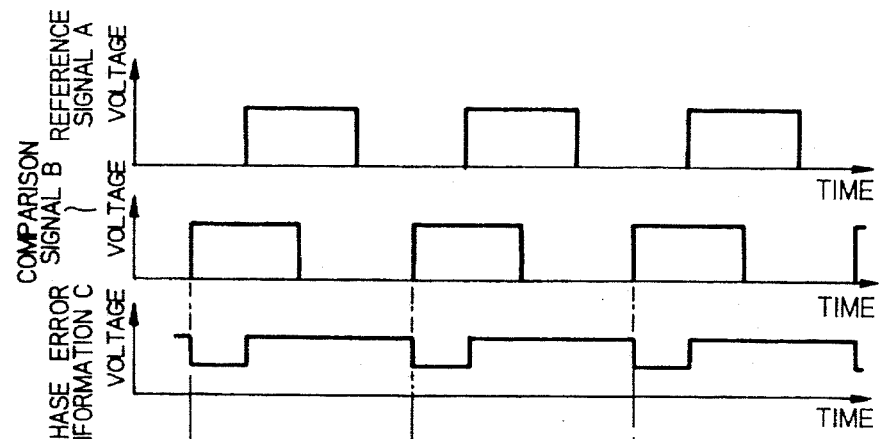
Fig.22A REFERENCE SIGNAL A
Fig.22B COMPARISON SIGNAL B
Fig.22C PHASE ERROR INFORMATION C
Fig.22D LOOP CONTROL INFORMATION D DIGITAL VALUE
Fig.22E OUTPUT OF PHASE ACCUMULATOR DIGITAL VALUE
Fig.22F OUTPUT OF COMPARISON SIGNAL GENERATION MEANS
Fig.22G COMPARISON SIGNAL B CHANGED IN LOOP
Fig.22H OUTPUT OF CLOCK OSCILLATOR 5,539,346

FREQUENCY SYNTHESIZER HAVING DDS IN PLACE OF VCO

INDUSTRIAL USE OF THE INVENTION

The present invention relates to a frequency synthesizer for generating a synchronizing signal which follows a reference signal.

PRIOR ART

The prior art frequency synthesizer is set forth in, for example, Japanese Patent Publication No. 3-38778 (1987). FIG. 1 is a block diagram illustrating the basic constitution of such a synthesizer.

In the drawing, the numeral 1 denotes a phase comparator; 2 a low-pass filter as a loop filter; 3 a voltage control oscillator as a variable frequency oscillator; 11a an accumulator as a waveform data reading means; 12 a memory as a look-up table; 13 a comparison signal generation means; 21 an address data setting means. The waveform data reading means 11a, the look-up table 12 and the comparison signal generating means 13 comprise a direct digital synthesizer.

Next, an operation of the frequency synthesizer indicated in FIG. 1 will be explained.

A PLL (Phase-Locked Loop) circuit comprises:

the phase comparator 1 for detecting a phase difference between a reference frequency and a comparison frequency, the low-pass filter 2, through which a phase difference signal to be outputted from said phase comparator 1 passes, the variable frequency oscillator 3 for oscillating the frequency F based on the phase difference signal; and a frequency synthesizer for inputting to the phase comparator 1 an oscillated frequency of the oscillator 3 as a comparison frequency, whereby the waveform data reading means 11a accesses the memory means 12 storing waveform data by an access signal based on address data set at the address data setting means 21 with the oscillation frequency F being used as a clock to thereby read predetermined waveform data; the comparison frequency generation means 13 generates a comparison frequency based on the waveform data by a D/A converter, etc., and; the phase comparator 1 compares a phase difference between the comparison frequency and the reference frequency, so that when the address data is changed, the access signal and the waveform data to be read also change and thus, the comparison frequency also changes, which finally changes the oscillation frequency F.

Then, the oscillator 3 oscillates at the oscillation frequency F which eliminates a phase difference between the reference frequency and the comparison frequency, whereby an oscillation frequency of the PLL circuit is locked.

According to the aforementioned frequency synthesizer, even if the reference frequency is set to a higher value, an output of a frequency pitch which is lower than a preset frequency pitch can be obtained, whereby a lock-up time of the PLL circuit is accelerated.

Because of the aforementioned structure, the prior art synthesizer has the following problems.

First, a phase-locked loop includes a variable frequency oscillator so as to follow a frequency of a reference signal. In order to follow a frequency of a reference signal which is set to cover or varies over a broad range, a variable frequency oscillator able to vary a frequency over a broad range is required. In that case, however, it is difficult to secure a high frequency stability, while it becomes difficult to set a broad range of change in frequency of the variable frequency oscillator when a high frequency stability is secured.

Secondly, dispersion of voltage/frequency conversion characteristics among variable frequency oscillators to be used and change in temperature or long-term use of the oscillator affect phase-locked loop characteristics.

SUMMARY OF THE INVENTION

The present invention has been accomplished in order to obviate the aforementioned problems. Thus, the object of the present invention is to provide a frequency synthesizer which is able to maintain a high frequency stability and yet follow a reference signal frequency which is set to cover or varies over a broad range, the frequency synthesizer being further provided with stable phase-locked loop characteristics, without dispersion of characteristics among the synthesizers and change in temperature or long-term use of the synthesizer because a variable frequency oscillator is not employed.

The object of the present invention is to provide a frequency synthesizer incorporating a direct digital synthesizer within a phase-locked loop, which comprises;

(a) a phase comparison means for detecting a phase difference between a reference signal and a comparison signal and for outputting phase error information having a sign and magnitude of the phase error, (b) a loop filter for generating loop control information having a sign and magnitude for controlling the loop in accordance with the phase error information; and (c) the direct digital synthesizer for generating the comparison signal by employing a clock signal from the outside of the phase-locked loop, in accordance with the loop control information which is an incremental value of a phase, being used as an input, whereby a synchronizing signal which follows a frequency of the reference signal that is set to cover or varies over a broad range is generated.

A further object of the present invention is to provide a frequency synthesizer incorporating a direct digital synthesizer within a phase-locked loop, which comprise:

(a) a phase comparison means for detecting a phase difference between a reference signal and a comparison signal and for outputting phase error information having a sign and magnitude of the phase error, (b) a loop filter for generating loop control information having a sign and magnitude for controlling a loop in accordance with the phase error information; and (c) the direct digital synthesizer for generating the comparison signal by employing a clock signal from the outside of the phase-locked loop, in accordance with the loop control information which is a phase incremental value, being used as an input; and (d) correcting means for receiving correction information from the outside of the loop and the loop control information to thereby obtain the phase incremental value, whereby a synchronizing signal which follows a frequency of the reference signal that is set to cover or varies over a broad range is generated.

A still further object of the present invention is to provide a frequency synthesizer incorporating a direct digital synthesizer within a phase-locked loop, which comprises:

(a) a phase comparison means for detecting a phase difference between a reference signal and a comparison signal and for outputting phase error information having a sign and magnitude of the phase error, (b) a loop filter for generating loop control information having a sign and magnitude for controlling the loop in accordance with the phase error information; and (c) the direct digital synthesizer for generating the comparison signal by employing a clock signal from the outside of the phase-locked loop, in accordance with the loop control information which is a phase incremental value, being used as an input; and (d) a frequency divider for dividing an output from the direct digital synthesizer to thereby make the comparison signal have a lower frequency, whereby a synchronizing signal which follows a frequency of the reference signal that is set to cover or varies over a broad range is generated.

A still further object of the present invention is to provide a frequency synthesizer incorporating a direct digital synthesizer within a phase-locked loop, which comprises:

(a) a phase comparison means for detecting a phase difference between a reference signal and a comparison signal and for outputting phase error information having a sign and magnitude of the phase error, (b) a loop filter for generating loop control information having a sign and magnitude for controlling the loop in accordance with the phase error information;

(c) the direct digital synthesizer for generating the comparison signal by employing a clock signal from the outside of the phase-locked loop, in accordance with the loop control information which is a phase incremental value, being used as an input;

(d) correcting means for receiving correction information from the outside of the loop and the loop control information to thereby obtain the phase incremental value; and (e) a frequency divider for dividing an output from the direct digital synthesizer to thereby make the comparison signal have a lower frequency, whereby a synchronizing signal which follows a frequency of the reference signal that is set to cover or varies over a broad range is generated.

According to a frequency synthesizer of the present invention, the phase comparison means detects a phase difference between a reference signal and a comparison signal to output phase error information having a sign and magnitude of the phase error, the loop filter generates loop control information having a sign and magnitude for controlling a phase-locked loop in accordance with the phase error information, and the direct digital synthesizer generates the comparison signal by employing a clock signal from the outside of the phase-locked loop, in accordance with loop control information which is a phase incremental value, being used as an input, whereby a synchronizing signal which is able to follow a frequency of the reference signal that is set to cover or varies over a broad range is generated. Furthermore, as the present synthesizer does not employ a variable frequency oscillator inside the loop, phase-locked loop characteristics can remain stable in relation to dispersion of characteristics among the synthesizers and change in temperature or long-time use of the synthesizer.

Furthermore, according to the present frequency synthesizer, the phase increment correction means receives correction information from the outside of the phase-locked loop and the loop control information to thereby obtain a phase incremental value, so that a follow-up range of the loop is broadened or is shifted. In other words, a reference signal can be set to cover or be varied over a broad range.

Furthermore, according to the present frequency synthesizer, an output signal from the direct digital synthesizer is turned into a comparison signal via the frequency divider instead of being inputted directly to the phase comparison means as it is. Therefore, output signals which are locked in phase with a reference signal and have frequencies equivalent to an integral multiple of different divided frequencies of the reference signal can be obtained.

Still further, according to the present invention, the phase increment correction means receives correction information from the outside of the phase-locked loop and the loop control information to thereby obtain a phase incremental value, whereby, for example, a follow-up range of the loop is broadened or shifted. Further, an output signal from the direct digital synthesizer is turned into a comparison signal via the frequency divider instead of being inputted directly to the phase comparison means as it is, whereby output signals which are locked in phase with a reference signal and have frequencies equivalent to an integral multiple of different divided frequencies of the reference signal can be obtained.

Still further, according to a frequency synthesizer of the present invention, an output signal from the direct digital synthesizer is turned into a comparison signal via the frequency divider instead of being inputted directly to the phase comparison means as it is, whereby an output signal which is locked in phase with a reference signal and has a frequency equivalent to a frequency obtained by dividing the reference signal can be obtained.

BRIEF EXPLANATION OF THE DRAWINGS

FIGS. 22A–22H show signal waveforms of essential parts of FIGS. 6 and 7.

EMBODIMENT

Embodiment 1

Hereinunder, embodiment 1 of a frequency synthesizer of the present invention will be explained by way of drawings.

Figure 1:
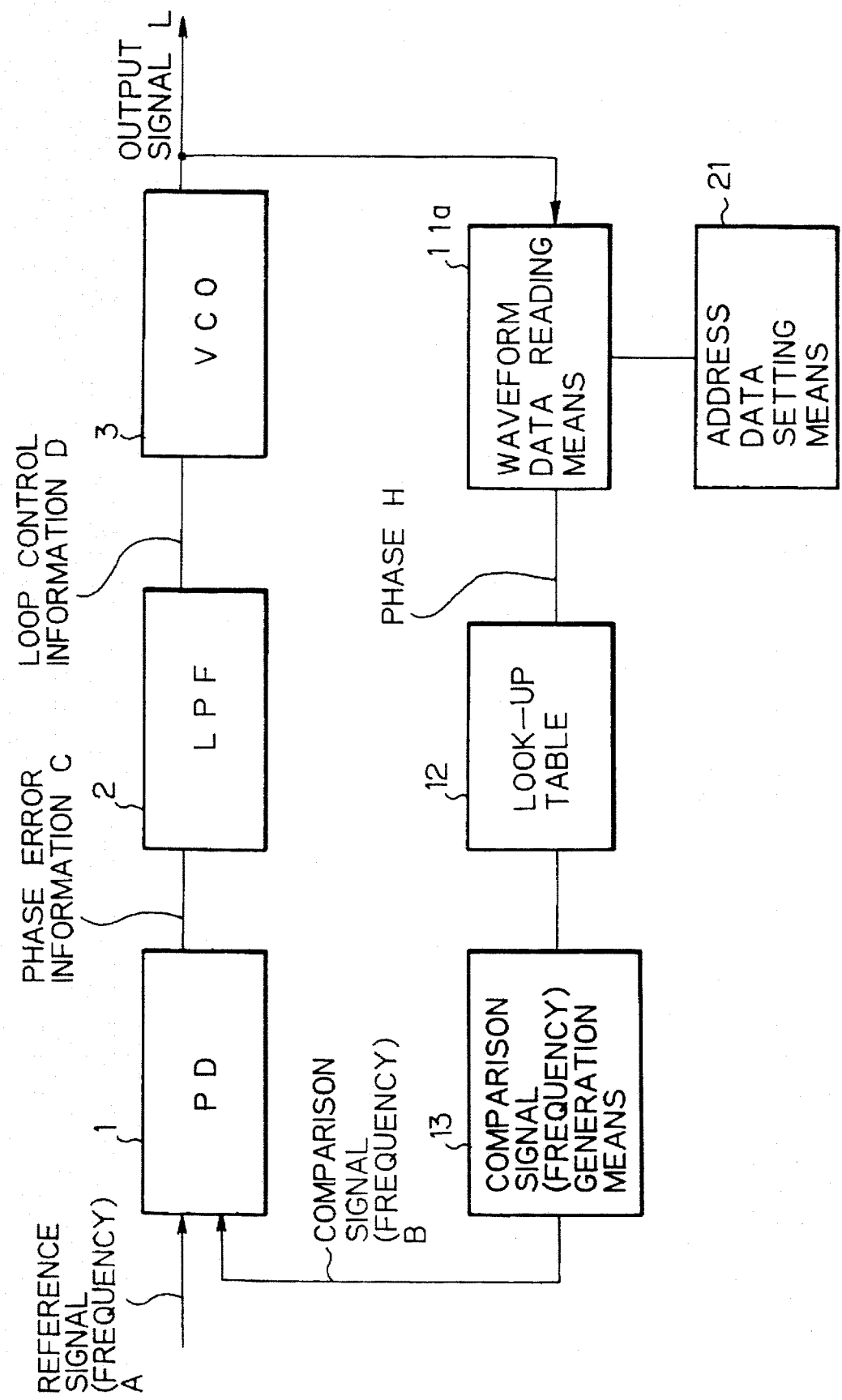
FIG. 1 is a block diagram illustrating the basic constitution of the prior art frequency synthesizer.
Figure 2:
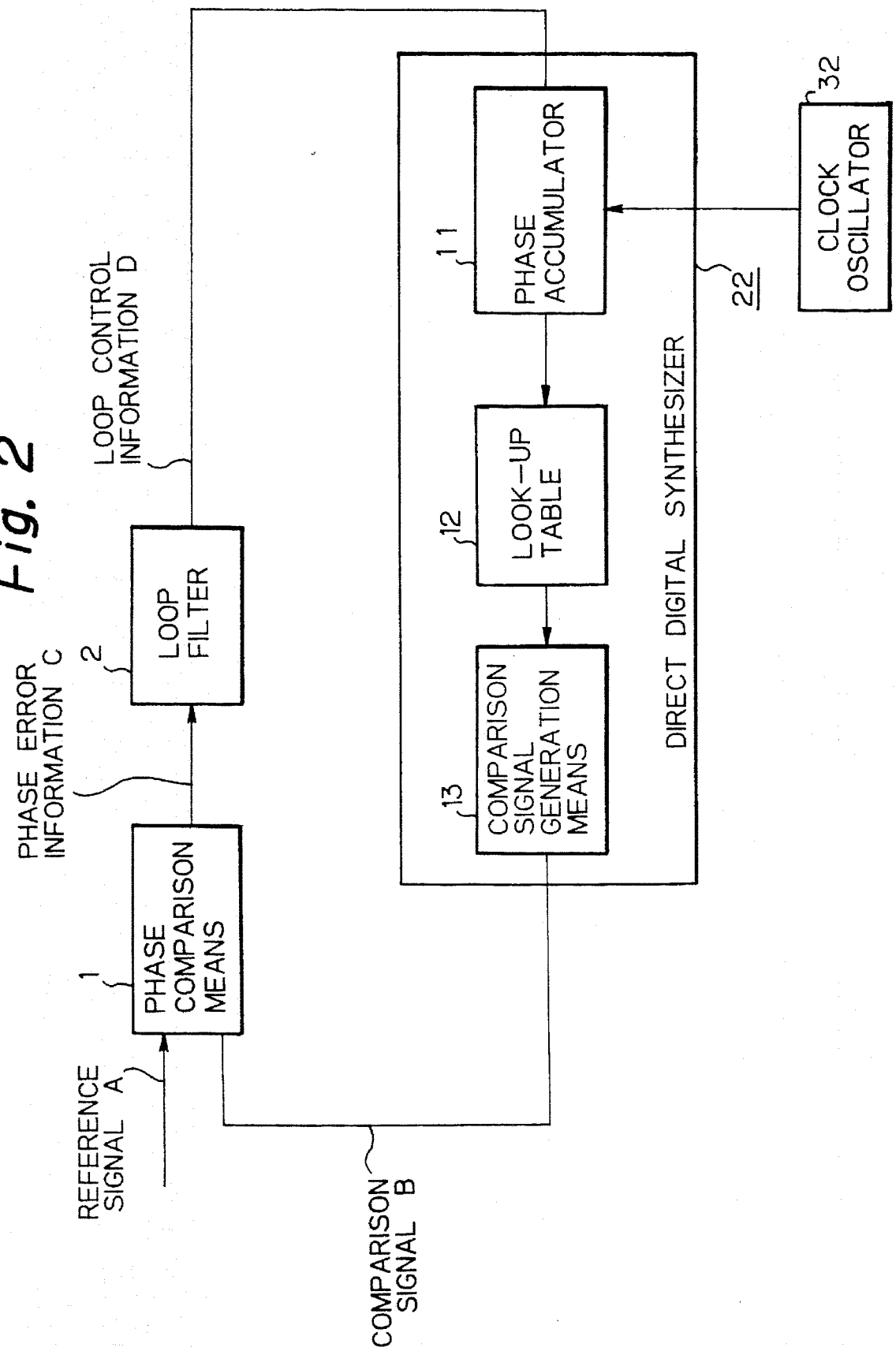
FIG. 2 is a block diagram illustrating the basic constitution of embodiment 1 of the present invention.

FIG. 2 is a block diagram illustrating the basic constitution of the embodiment 1.

In FIG. 2, the phase comparison means 1 detects a phase difference between the reference signal A and the comparison signal B to output the phase error information C having a sign and magnitude of the phase error. The loop filter 2 generates the loop control information D having a sign and magnitude for controlling a phase-locked loop in accordance with the phase error information C.

The phase accumulator 11 inputs the loop control information D as a phase incremental value and performs a cumulative addition by employing a clock output from the clock generator 32 outside of the phase-locked loop. The thus cumulatively added value constitutes phase information representing a phase.

The look-up table 12 outputs waveform data corresponding to the phase by using the phase information as address data. The comparison signal generation means 13 takes necessary frequency components out of a sequence of signals where waveform data in the look-up table is arranged in time series, and then generates the comparison signal B.

FIGS. 20A–20G show signal waveforms of essential parts in FIG. 2.

Figure 20A:
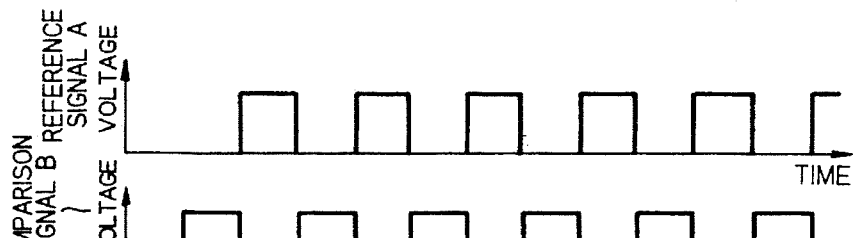
FIGS. 20A–20G show signal waveforms of essential parts of FIGS. 2 and 3.
Figure 20B:
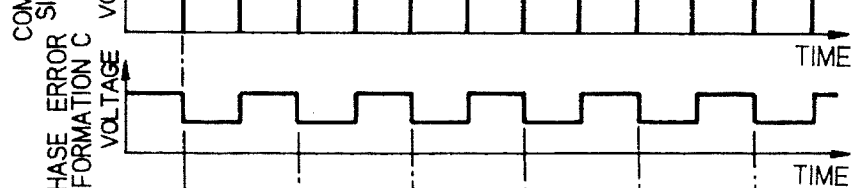

In FIG. 20A, the reference signal A comprises a logical waveform such as TTL and ECL. In FIG. 20B, the comparison signal B represents a signal in the loop. As is indicated by the signal waveforms in FIGS. 20A and 20B, the reference signal A and the comparison signal B are not locked in phase and have a phase difference of about 180°.

Figure 20C:
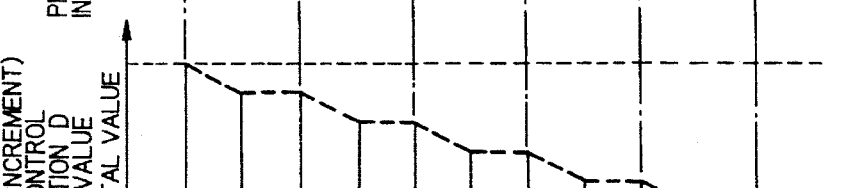

Next, the phase comparison means 1 compares the reference signal A with the comparison signal B to output the phase error information C indicated by the signal waveform in FIG. 20C. In this case, since a phase of the comparison signal B is advanced compared to the reference signal A, the phase error information C having a voltage which is lower than a reference voltage by an amount equivalent to the advancement in phase is outputted. On the other hand, when the phase lags, a voltage which is higher than a reference voltage by an amount equivalent to the lag in phase is outputted. If there is no phase error, a reference voltage is outputted as it is.

Figure 20D:
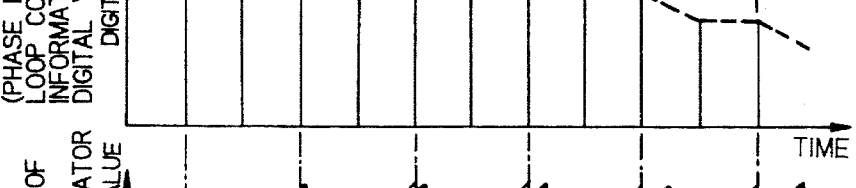
Figure 20E:
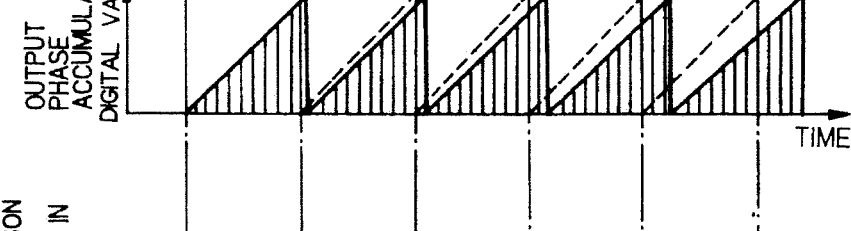

The phase error information C is integrated by the loop filter 2 and then outputs the loop control information D indicated by the signal waveform in FIG. 20D. The loop filter 2 integrates a voltage lower than the reference voltage and outputs the thus integrated voltage.

Next, the loop control information D is inputted to the phase accumulator 11 as an incremental value of the phase. The phase accumulator 11 accumulates the loop control information D by using as a reference a timing of an output from the clock oscillator, indicated by the signal waveform in FIG. 20G. The clock is designed for one cycle of the comparison signal B to include more than two clocks. As is indicated by the signal waveform in FIG. 20E, as a signal voltage value of the loop control information D becomes low, an interval between cycles of a triangle wave to be generated at the phase accumulator 11 becomes wide.

Figure 20F:
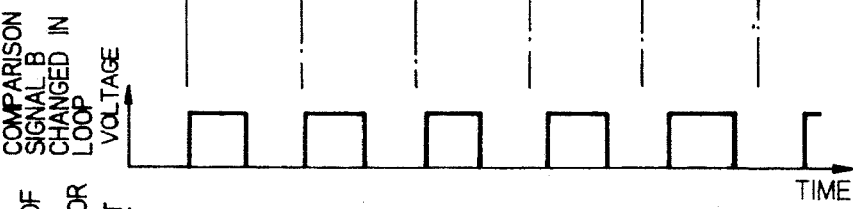
Figure 20G:
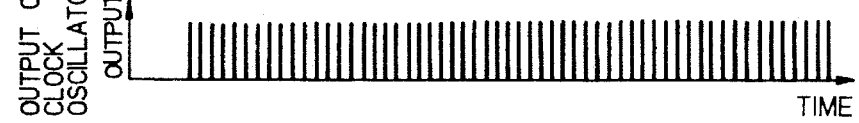

The look-up table 12 outputs waveform data corresponding to a phase with the phase information being employed as address data. The comparison signal generation means 13 takes necessary frequency components out of a sequence of signals wherein waveform data in the look-up table is arranged in time series, whereby the comparison signal B indicated by the waveform in FIG. 20F is generated.

Figure 3:
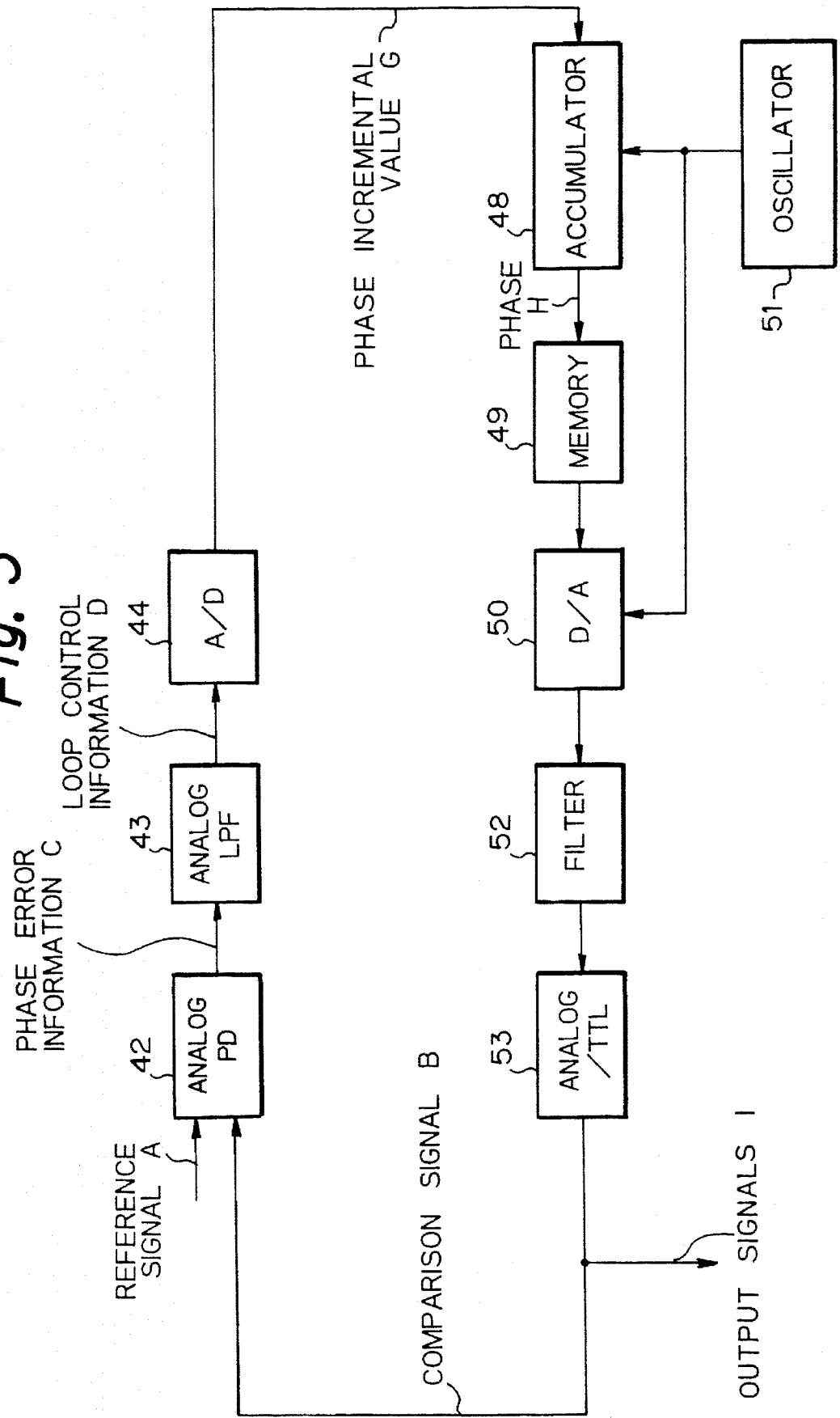
FIG. 3 is a block diagram showing a more specific constitution of the synthesizer indicated in FIG. 2.

FIG. 3 is a block diagram showing a more specific constitution of the embodiment indicated in FIG. 2.

In FIG. 3, the numeral 42 denotes an analog phase comparator (hereinafter referred to as an analog PD); 43 an analog low-pass filter (hereinafter referred to as an analog LPF); 44 an analog-digital converter (hereinafter referred to as an A/D); 48 an accumulator; 49 a memory for storing waveform data; 50 a digital-analog converter (hereinafter, referred to as D/A); 51 an oscillator; 52 a filter; 53 an analog-TTL level converter (hereinafter referred to as an analog/TTL). Furthermore in the drawing, A denotes a reference signal; B a comparison signal; C phase error information; D loop control information; G a phase incremental value; H a phase; I an output signal.

A phase of the reference signal A and that of the comparison signal B are compared at the analog PD 42, whereby the phase error information C proportional to the phase difference between them is outputted. The phase error information C is integrated at the analog LPF 43 which has a relatively narrow band, whereby the loop control information D in an analog value is outputted. The loop control information D constitutes the phase incremental value G converted to a digital value by the A/D 44.

The phase accumulator 48 adds up the phase incremental value G by using a clock from the oscillator 51 disposed outside the phase-locked loop and then outputs the phase H. The H represents a phase of the waveform data stored in the memory 49 and also represents an address of the memory 49, and thus the waveform data is read by using the address. The waveform data is converted to analog values by the D/A 50 and is passed through the filter 52 in order to take out necessary frequency components. In general, an LPF is employed for the filter 52. However, when a Nyguist's reflected frequency is utilized, a BPF may be used so as to generate a higher frequency.

An analog signal which passed through the filter 52 is converted to a TTL level at the analog/TTL 53, if a signal of TTL level is to be taken out as the phase-locked output signal I. In this case, the phase-locked output signal I turns into the comparison signal B to thereby comprise a phase-locked loop.

When a frequency of the reference signal A becomes high, the phase-locked loop operates in such a manner that the phase incremental value G increases and hence a frequency of the comparison signal B becomes high, whereby the signals are phase-locked. On the other hand, when a frequency of the reference signal A becomes low, the phase-locked loop operates in such a manner that the phase incremental value G becomes small to lower a frequency of the comparison signal B, whereby the signals are phase-locked. Thus, the output signal I locked in phase with the reference signal A can be obtained.

As is explained above, the direct digital synthesizer (DDS) 22 generates the comparison signal by using a clock from the outside of a phase-locked loop with a phase incremental value, that is, loop control information being employed as an input, whereby it becomes possible to generate a synchronizing signal which is able to follow a frequency of the reference signal which is set to cover and varies over a broad range. Furthermore, as an analog part such as a variable frequency oscillator is not included in the loop, it is possible to obtain a frequency synthesizer which is able to keep phase-locked loop characteristics stable in relation to dispersion of characteristics among the synthesizers and change in temperature or long-term use of the synthesizer and is also free from restrictions on a compact size synthesizer.

Embodiment 2

Hereinafter, embodiment 2 of the present invention will be explained by way of drawings.

Figure 4:
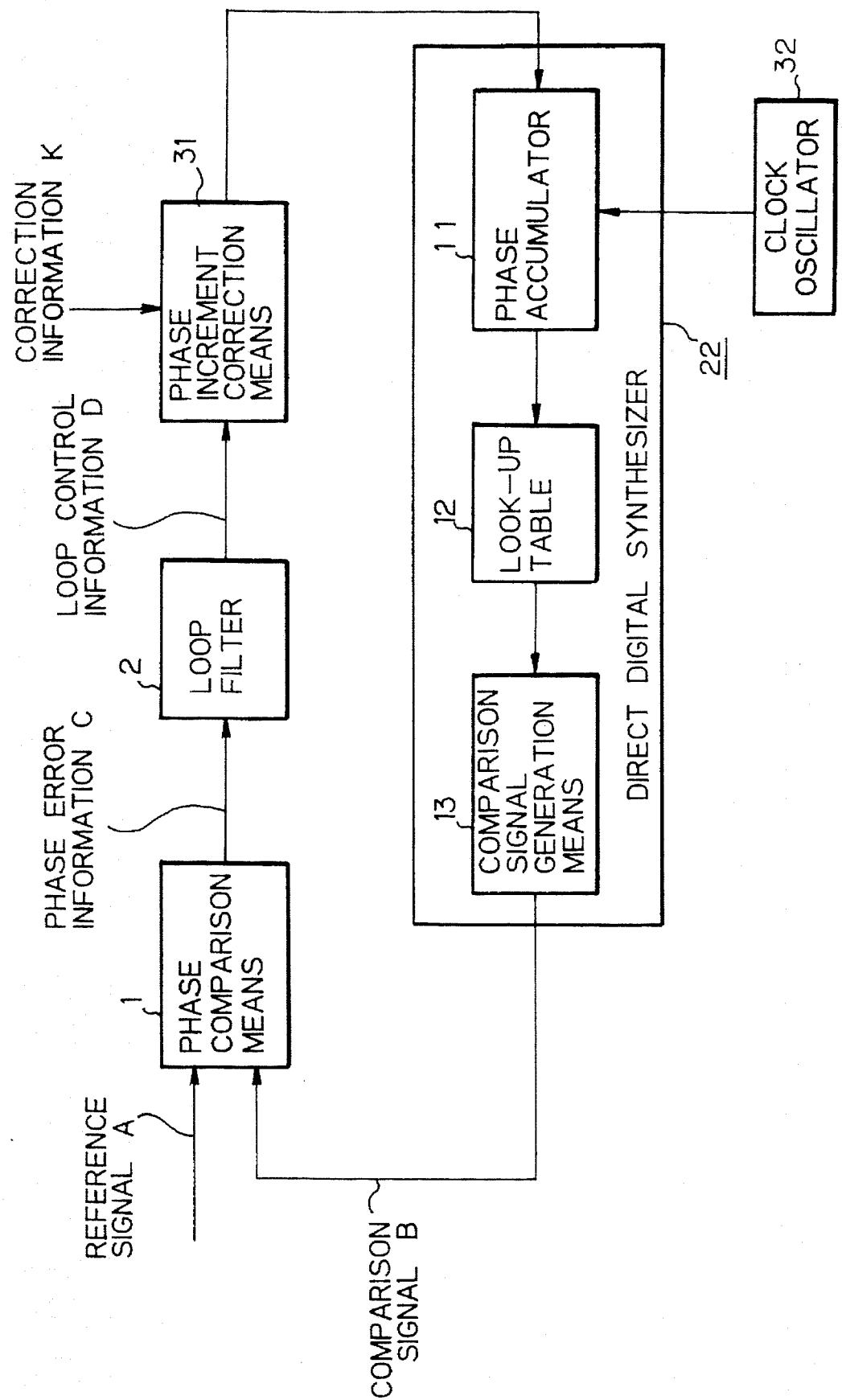
FIG. 4 is a block diagram illustrating the basic constitution of embodiment 2 of the present invention.

FIG. 4 is a block diagram showing the basic constitution of the embodiment 2.

The embodiment 2 is characterized in that the output of the loop filter 2 incorporated in the phase-locked loop of the embodiment 1 is provided with the phase increment correction means 31.

As the same components in the embodiments 1 and 2 are denoted by the same symbols, explanation about such components is omitted here.

The phase increment correction means 31 receives the gain offset information K from the outside of the phase-locked loop and the loop control information D to thereby generate phase incremental value G. This gain offset information constitutes an example of correction information. A follow-up range of the loop is broadened by increasing a gain, whereas the follow-up range of the loop can be shifted by providing offset. Although a set value for the gain information or the offset information from the outside of the loop is provided by a CPU etc., it does not have to be a CPU and a setting switch may be employed instead.

When the phase comparison means comprises a digital circuit, the phase error information and the loop control information are generally also in a digital value. Therefore, such information fit the input of both the phase increment correction means 31 and the phase accumulator 11.

Figure 5:
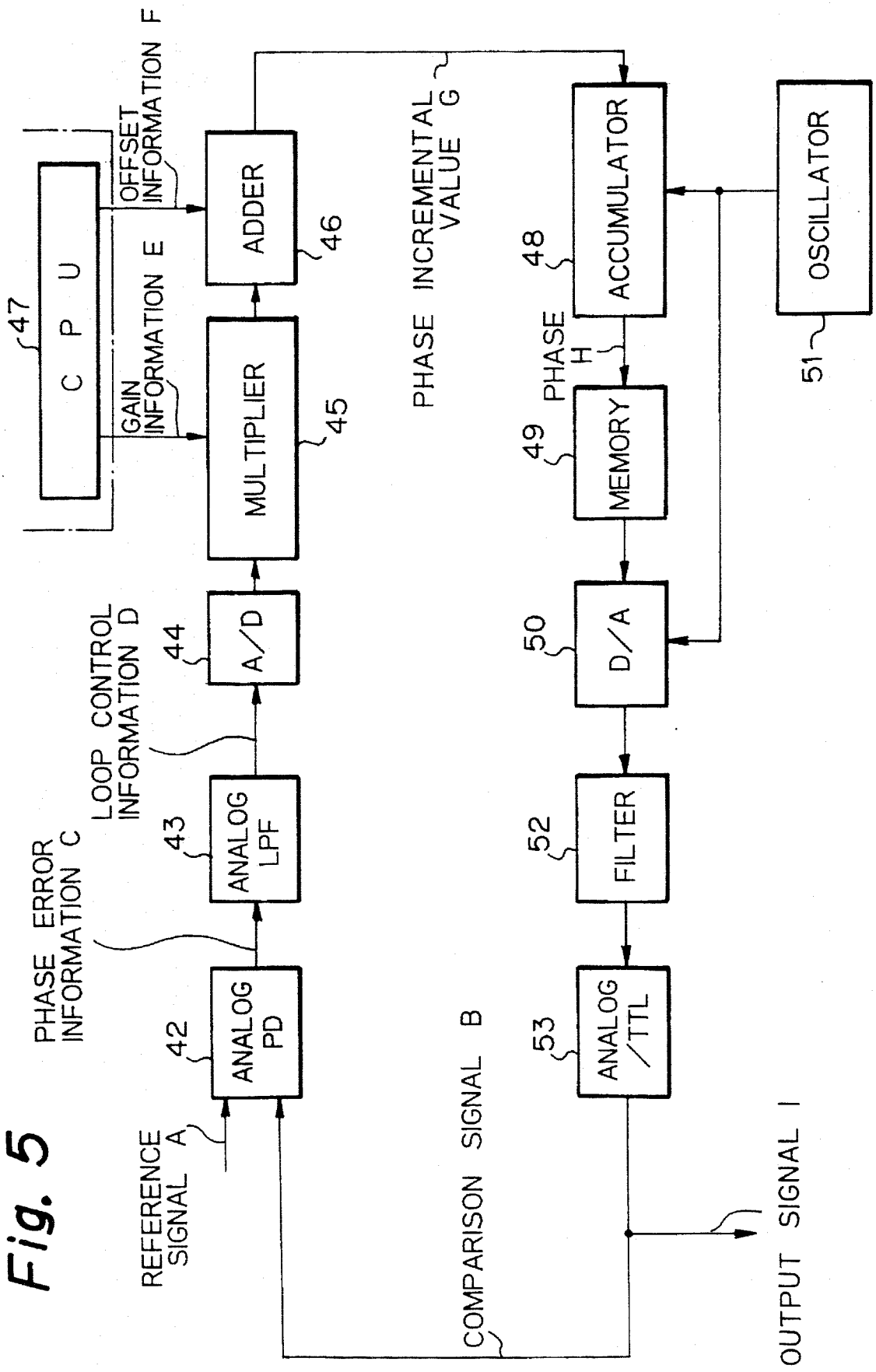
FIG. 5 is a block diagram showing a more specific constitution of the synthesizer indicated in FIG. 4.
Figure 21A:
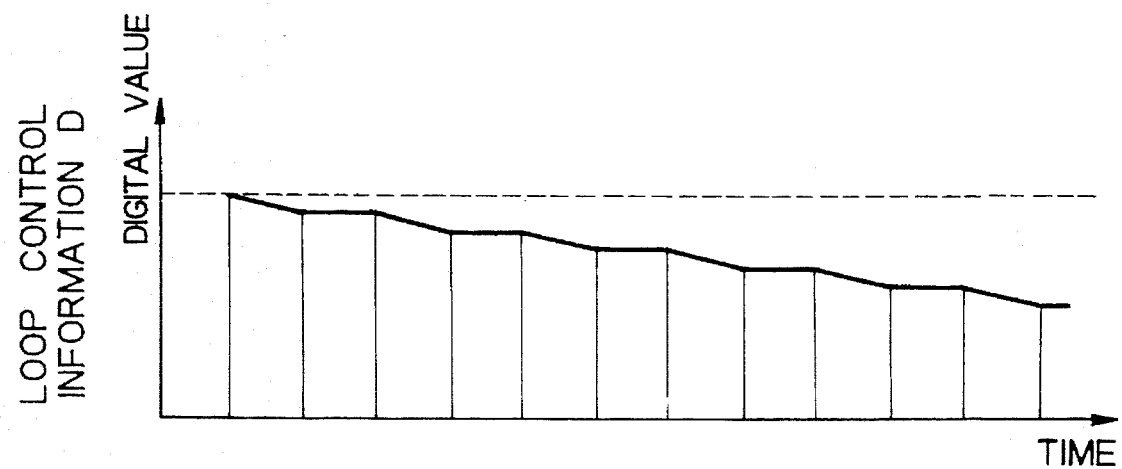
FIGS. 21A and 21B show signal waveforms of essential parts of FIGS. 4 and 5.
Figure 21B:
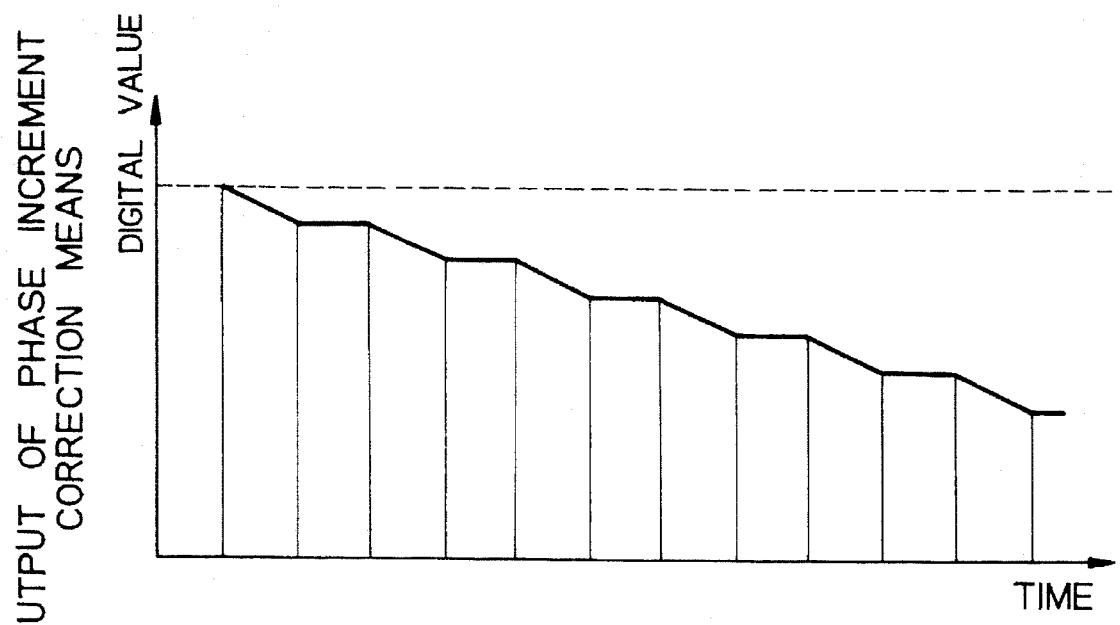

FIGS. 21A and 21B show signal waveforms of the loop control information D and the output from the phase increment correction means 31, indicated in FIGS. 4 and 5.

FIG. 21A is a signal waveform indicating the loop control information D, whereas FIG. 21B is a signal waveform indicating an output from the phase incremental correction means 31. The phase increment correction means 31 in this embodiment comprises the multiplier 45, adder 46 and CPU 47 as is indicated in FIG. 5. Comparing FIG. 21A with FIG. 21B, a gradient of the line in FIG. 21B is sharper than that in FIG. 21A due to the gain information E to the multiplier 45. Furthermore, due to the offset information F to the adder 46, the initial output value indicated in a dotted line in FIG. 21B is higher than that in FIG. 21A.

FIG. 5 is a block diagram showing a more specific constitution indicated in FIG. 4.

In FIG. 5, the numeral 45 denotes a multiplier; 46 an adder; 47 a CPU (which is disposed outside of a frequency synthesizer); E gain information; F offset information.

By employing an output from the A/D 44 provided with the gain and offset information as the phase incremental value G instead of employing the output from the A/D 44 as the phase incremental value G as it is, the loop characteristics can be easily changed by the setting operation from the CPU disposed outside of the phase-locked loop.

Thus, in addition to the same effects as those of the frequency synthesizer of the embodiment 1, the phase incremental correction means receives the gain/offset information from the outside of the loop and the loop control information and then produces the phase incremental value, so that a frequency synthesizer wherein a follow-up range of the loop can be broadened or shifted can be obtained.

Embodiment 3

Embodiment 3 of the present invention will be explained by way of drawings.

Figure 6:
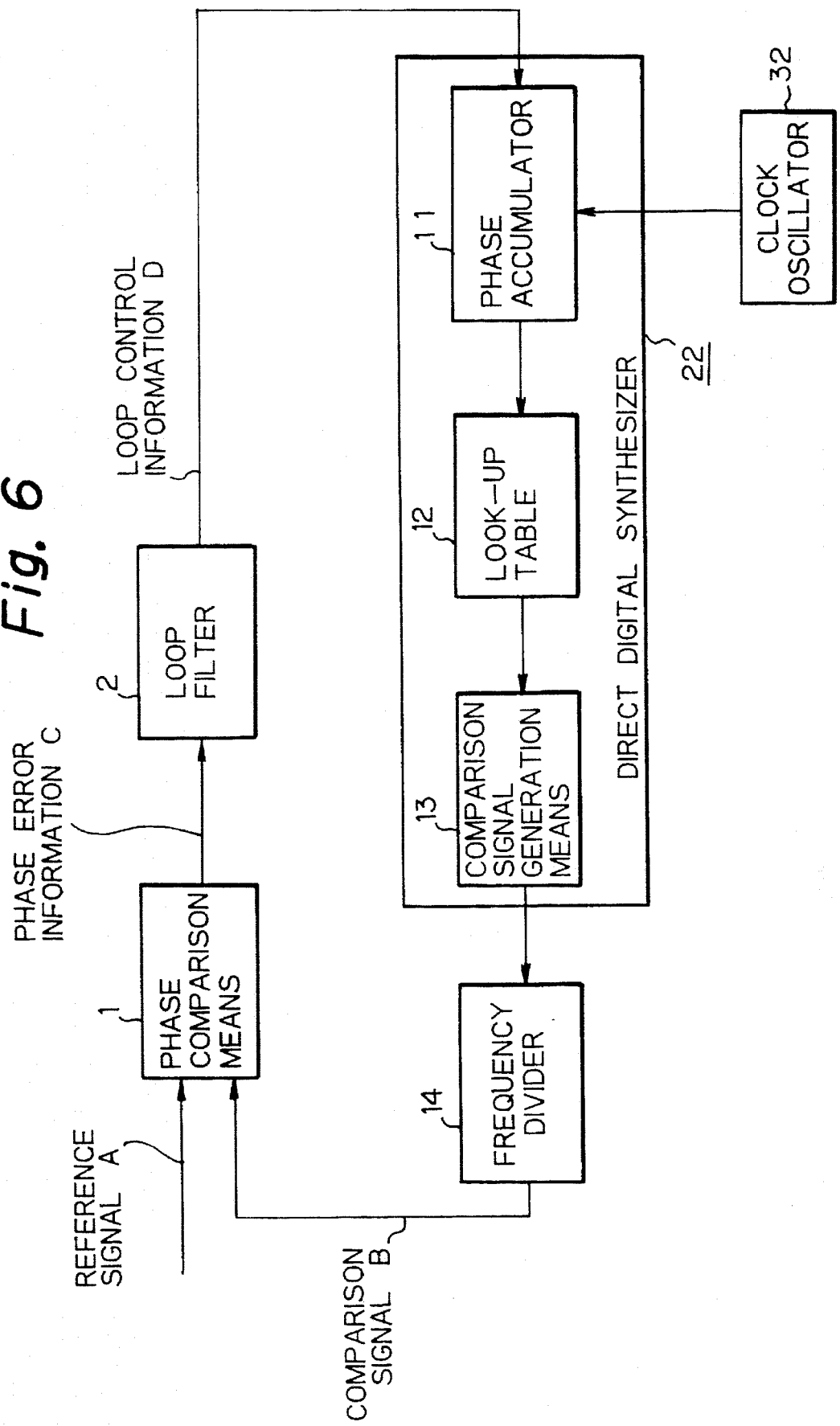
FIG. 6 is a block diagram illustrating the basic constitution of embodiment 3 of the present invention.

FIG. 6 is a block diagram showing the basic constitution of the embodiment 3.

The embodiment 3 is also characterized in that the output of the DDS 22 comprising the phase-locked loop indicated in the embodiment 1 is provided with frequency divider 14.

As the same components in the embodiments 1 and 3 are denoted by the same symbols, explanation about such components is omitted here.

The frequency divider 14 divides a frequency outputted from the comparison signal generation means 13 to thereby generate the comparison signal B.

Figure 7:
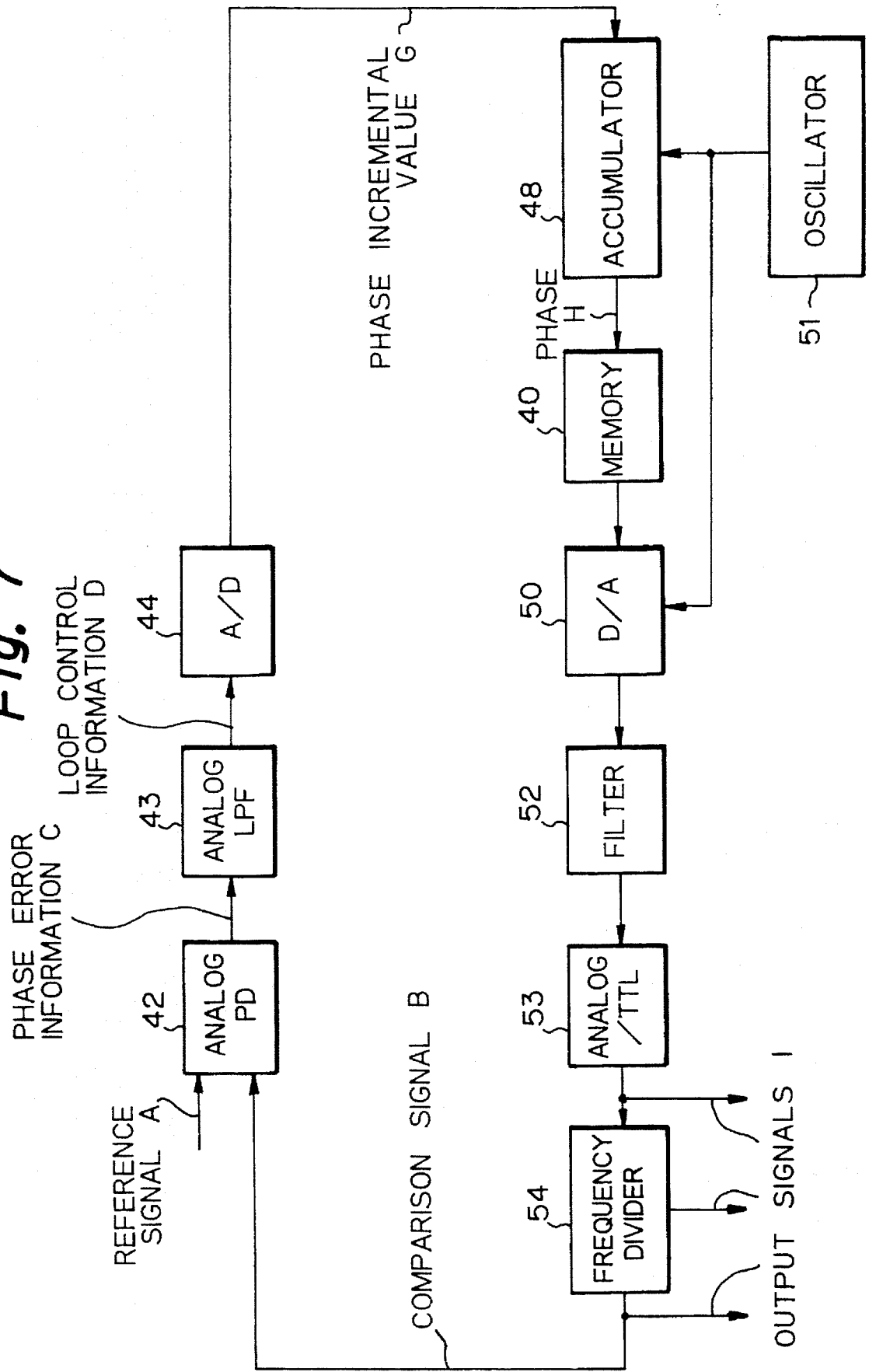
FIG. 7 is a block diagram showing a more specific constitution of the synthesizer indicated in FIG. 6.

FIGS. 22A–22H are signal waveforms of essential parts of FIGS. 6 and 7.

In FIG. 22A, the reference signal A comprises a logic waveform such as TTL and ECL. On the other hand, in FIG. 22B, the comparison signal B represents a signal inside the loop. As is clear from the signal waveforms in FIGS. 22A and 22B, the reference signal A and the comparison signal B are not locked in phase and have a phase difference of about 90°.

Next, the phase comparison means 1 compares the reference signal A with the comparison signal B to output the phase error information C indicated by the signal waveform in FIG. 22C. In this case, since a phase of the comparison signal B is advanced compared to the reference signal A, the phase error information C having a voltage which is lower than a reference voltage by an amount equivalent to the advancement in phase is outputted.

The phase error information C is integrated by the loop filter 2 and then, the loop control information D indicated by the signal waveform in FIG. 22D is outputted. The loop filter 2 integrates a voltage lower than the reference voltage and outputs the thus integrated voltage.

Next, the loop control information D is inputted to the phase accumulator 11 as a phase increment value. The phase accumulator 11 accumulates the loop control information D by using as a reference a timing of an output from the clock oscillator, indicated by the signal waveform in FIG. 22H. Unlike the embodiment 1, the phase accumulator 11 or the look-up table 12 is adjusted in such a manner that a frequency of signal outputted from the comparison signal generation means 13 becomes twice as high as a frequency of the reference signal. As is indicated by the signal waveform in FIG. 22E, as a signal voltage of the loop control information D becomes low, an interval between cycles of a triangle wave generated at the phase accumulator 11 becomes wide.

The look-up table 12 outputs waveform data corresponding to the phase with the phase information being employed as address data. The comparison signal generation means 13 takes necessary frequency components out of a sequence of signals where waveform data of the look-up table is arranged in time series, whereby the comparison signal indicated by the signal waveform in FIG. 22F is generated.

Furthermore, the comparison signal is inputted to the frequency divider 14, where a frequency thereof is divided in half. The signal thus subjected to the frequency divider 14 is outputted as the comparison signal B indicated by the signal waveform in FIG. 22G.

Thus, a phase of the comparison signal B indicated by the signal waveform in FIG. 22G gradually lags behind a phase of the comparison signal B indicated by the signal waveform in FIG. 22B, whereby the comparison signal B is locked in phase with the reference signal A. In particular, before the comparison signal is inputted to the frequency divider 14, it has a frequency twice as high as that of the reference signal A and can be locked in phase therewith.

FIG. 7 is a block diagram showing a more specific constitution of the embodiment indicated in FIG. 6.

In FIG. 7, the numeral 54 denotes a frequency divider.

By turning the output from the analog/TTL 53 at the last stage of the DDS 22 into the comparison signal B via the newly provided divider 54 instead of turning the output directly into the comparison signal B as it is, the output signals I locked in phase with a reference signal, frequencies of which are equivalent to an integral multiple of different divided frequencies of the reference signal can be obtained.

Since a signal which is locked in phase with the reference signal A and has a frequency twice or four times as high as that of the reference signal can be obtained, it can be employed as a clock frequency of a digital circuit which is required to be locked in phase with the reference signal A.

As is explained above, by turning the output signal from the direct digital synthesizer into a comparison signal via the divider instead of turning the output directly into a comparison signal to be inputted to the phase comparison means as it is, a frequency synthesizer which not only has the same effects as the frequency synthesizer of the embodiment 1 but also is able to obtain output signals locked in phase with a reference signal, frequencies of which are equivalent to an integral multiple of different divider frequencies of the reference signal can be obtained.

Embodiment 4

Hereinafter, embodiment 4 of a frequency synthesizer of the present invention will be explained by way of drawings.

Figure 8:
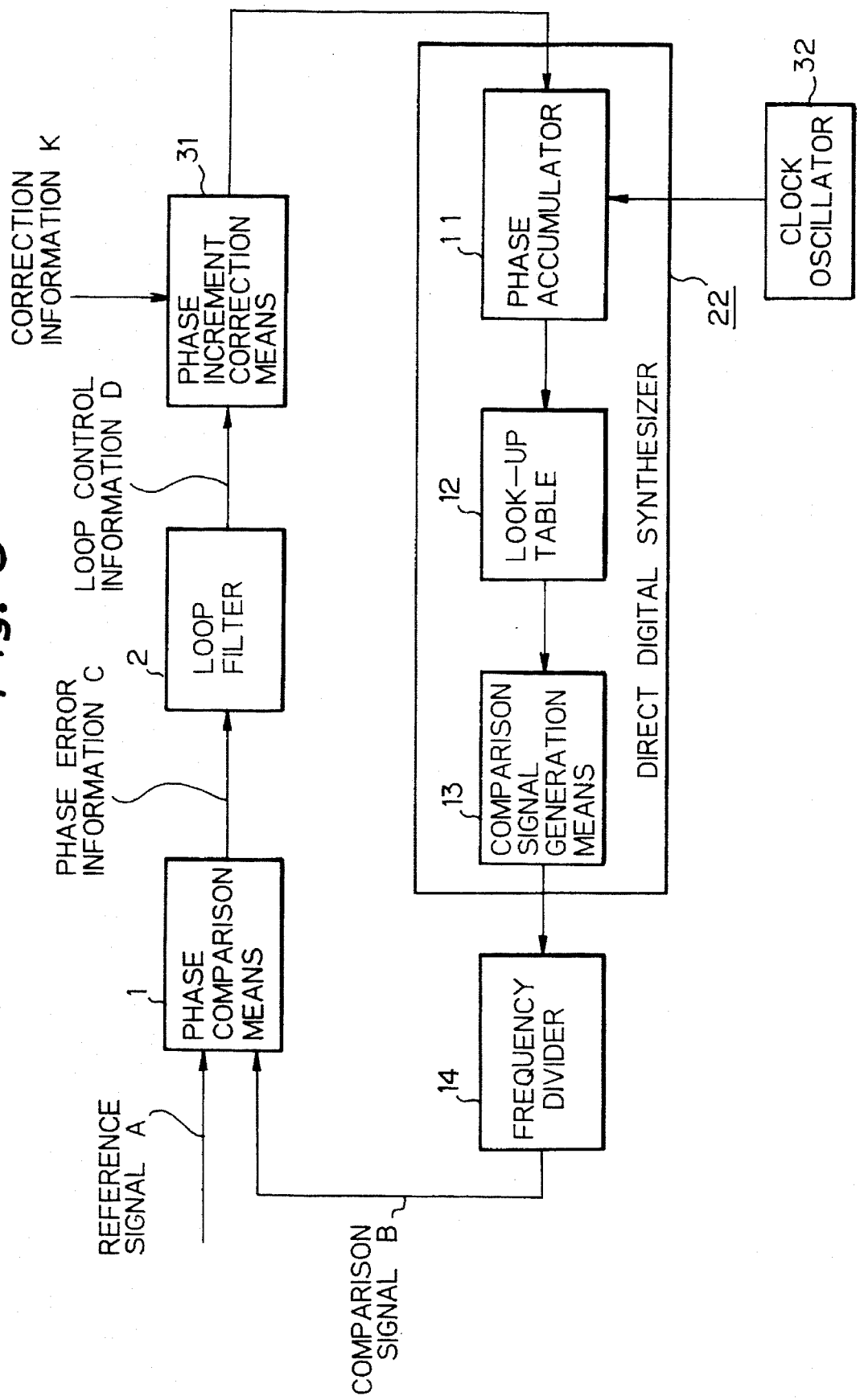
FIG. 8 is a block diagram illustrating the basic constitution of embodiments 4 and 5 of the present invention in common.

FIG. 8 is a block diagram showing the basic constitution of the embodiments 4 and 5 in common.

The embodiment 4 is characterized in that the output of the DDS 22 comprising the phase-locked loop indicated in the embodiment 2 is provided with the frequency divider 14. In other words, the embodiment 4 is comprised of a combination of the embodiments 2 and 3.

Since the same components in the embodiments 2 and 4 are denoted by the same symbols, an explanation about such components is omitted here.

Figure 9:
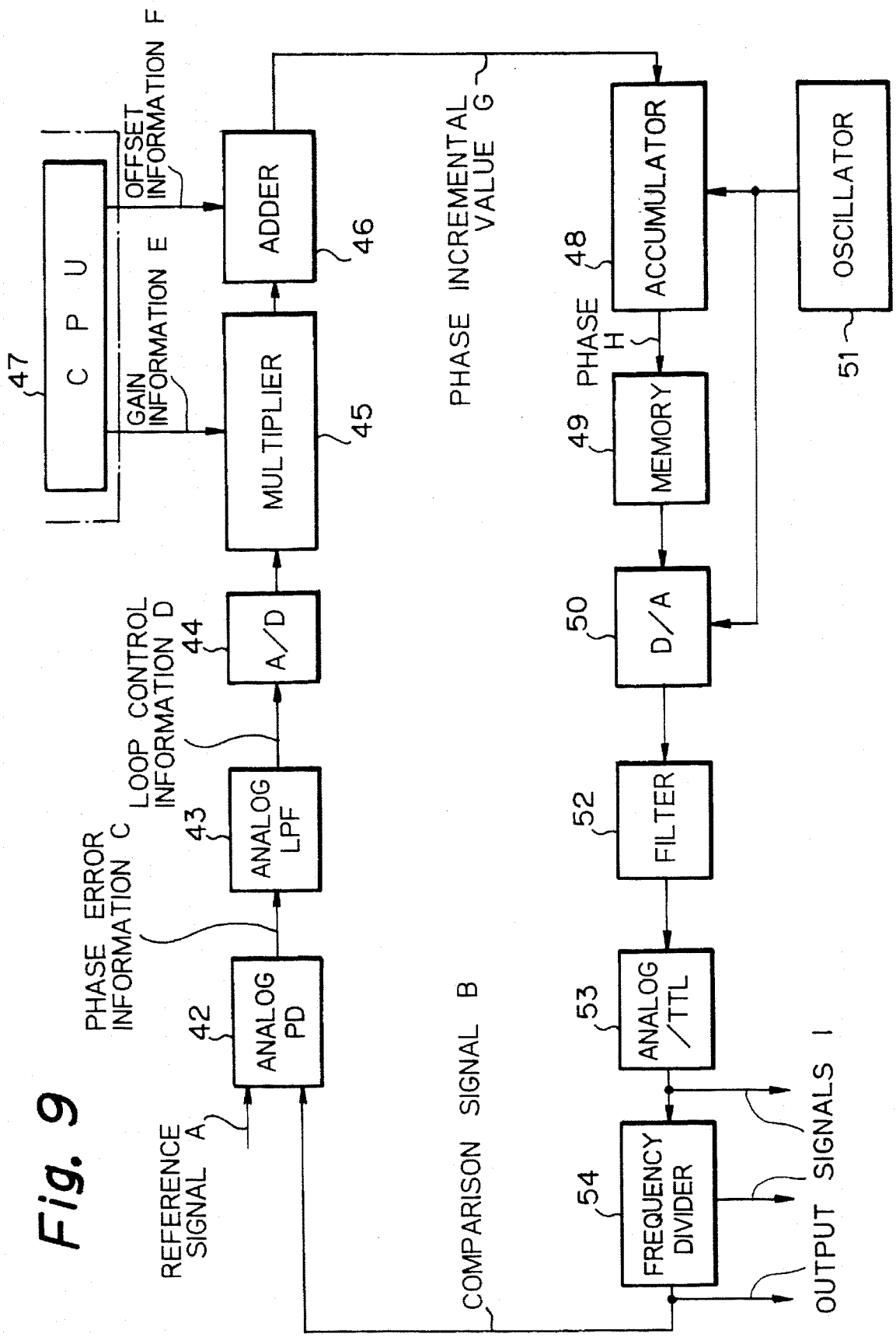
FIG. 9 is a block diagram showing a more specific constitution of the synthesizer according to the embodiment 4.

FIG. 9 is a block diagram showing a more specific constitution of the embodiment 4.

In FIG. 9, it is characteristic that the output of the analog/TTL 53 at the last stage of the DDS 22 comprising the phase-locked loop indicated in the embodiment 2 is provided with the frequency divider 54.

In this case, three output signals I locked in phase with the reference signal A can be obtained from both ends and middle part of the frequency divider 54.

As is clear from the above, according to the embodiment 4, the phase increment correction means receives the gain offset information from the outside of the phase-locked loop and the loop control information to produce the phase increment value G, whereby a frequency follow-up range of the loop can be broadened or shifted, whereas an output signal from the direct digital synthesizer is turned into a comparison signal via the divider instead of turning the same into a comparison signal to be inputted to the phase comparison means as it is, whereby it becomes possible to provide a frequency synthesizer which not only has the same effects as those of the frequency synthesizer of the embodiment 1 but also is able to obtain output signals locked in phase with a reference signal, frequencies of which are equivalent to an integral multiple of different divided frequencies of the reference signal.

Embodiment 5

Figure 10:
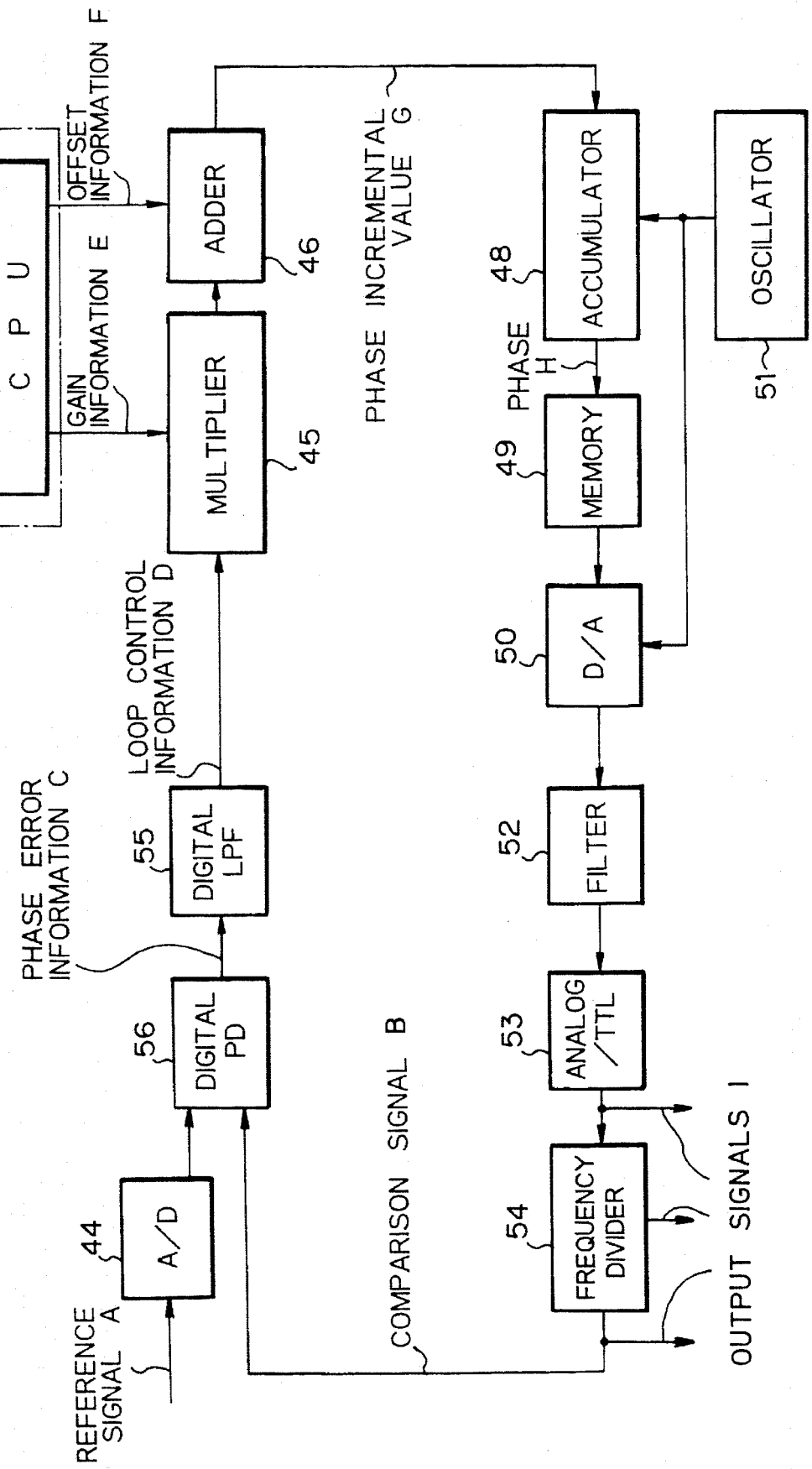
FIG. 10 is a block diagram showing a more specific constitution of the synthesizer according to the embodiment 5.

FIG. 10 is a block diagram showing a more specific constitution of the embodiment 5.

In FIG. 10, the embodiment is characterized in that the analog PD 42 comprising the phase-locked loop in the embodiment 4 is replaced with the digital phase comparator 56 (hereinafter referred to as the digital PD), the analog LPF 43 being replaced with the digital LPF 55, the A/D 44 being moved to the input stage of the reference signal A of the digital PD.

Thus, by digitalizing the phase comparator and the LPF, it becomes possible to stabilize phase-locked loop characteristics in relation to dispersion of characteristics among the synthesizers and change in temperature or long-time term use of the synthesizer and to obviate restrictions imposed in making a synthesizer compact.

Embodiment 6

Hereinafter, embodiment 6 of a frequency synthesizer of the present invention will be explained by way of drawings.

Figure 11:
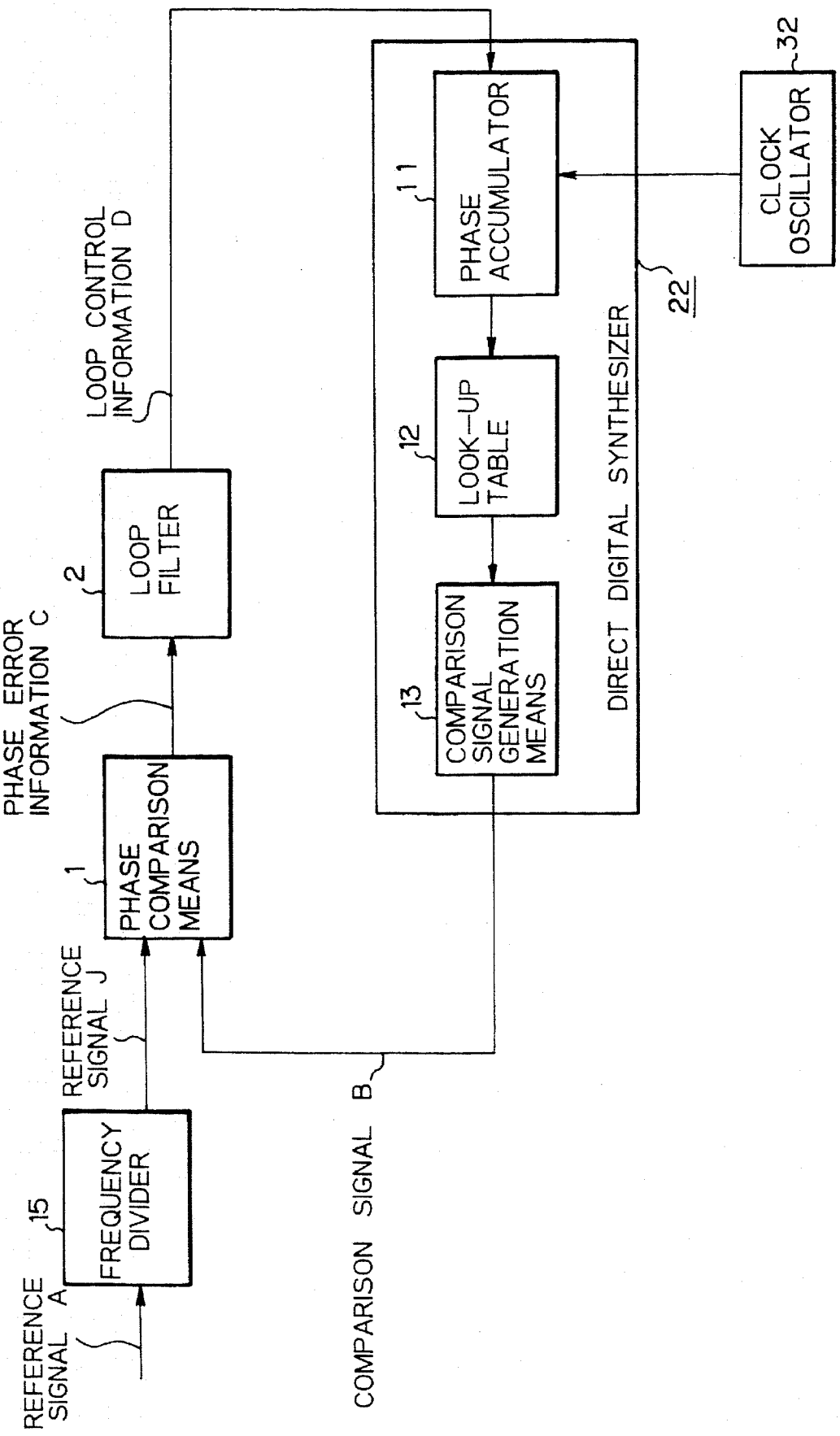
FIG. 11 is a block diagram illustrating the basic constitution of embodiment 6 of the present invention.

FIG. 11 is a block diagram showing the basic constitution of the embodiment 6.

The embodiment 6 is characterized in that the input stage of the reference signal A of the phase comparison means 1 comprising the phase-locked loop of the embodiment 1 is provided with the frequency divider 15, which divides a frequency of the reference signal A to obtain the reference signal J, and the thus obtained reference signal J is turned into an input signal to be inputted to the phase comparison means 1.

The same components in the embodiments 1 and 6 are denoted by the same symbols and therefore, an explanation of such components is omitted here.

Figure 12:
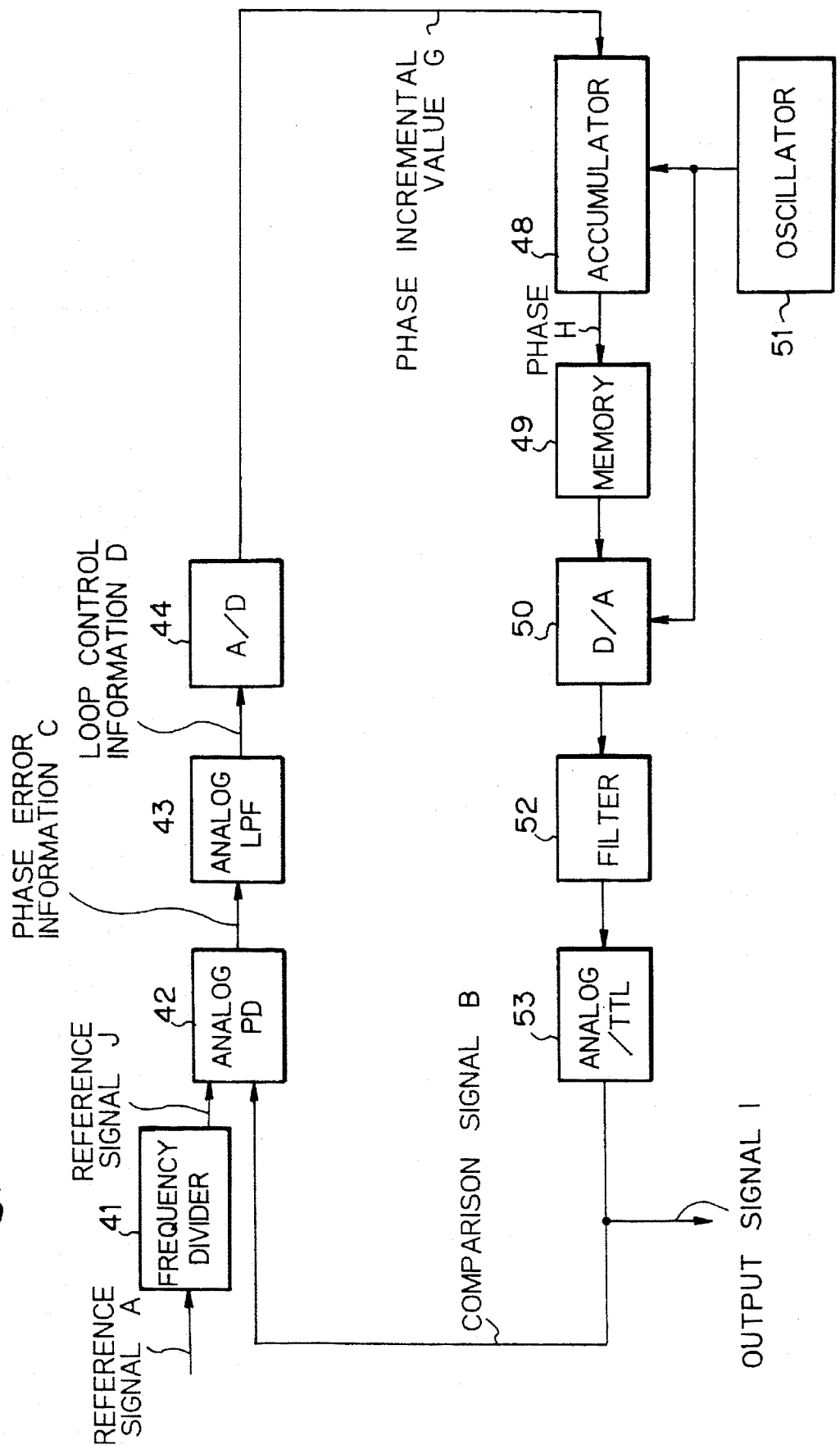
FIG. 12 is a block diagram showing a more specific constitution of the synthesizer indicated in FIG. 11.
Figure 23A:
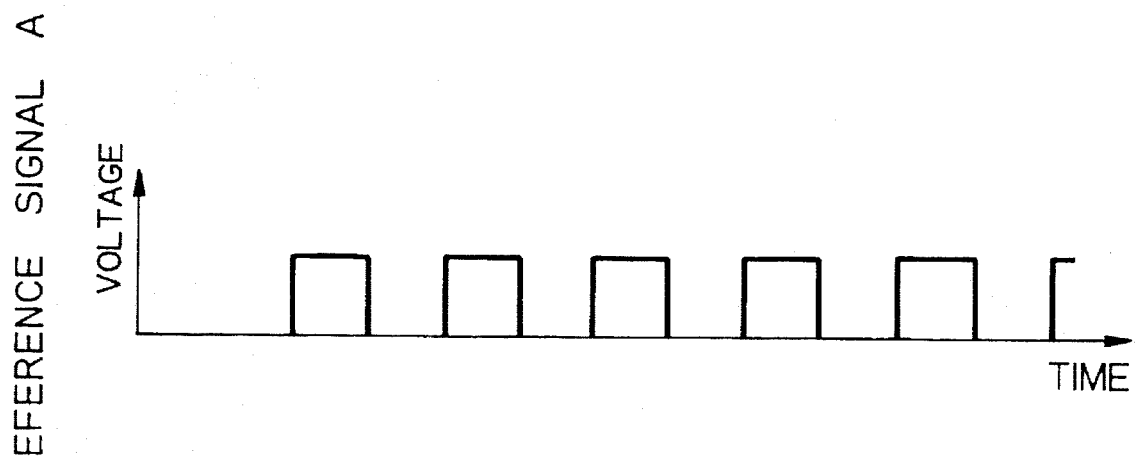
FIGS. 23A and 23B show signal waveforms of essential parts of FIGS. 11 and 12.
Figure 23B:
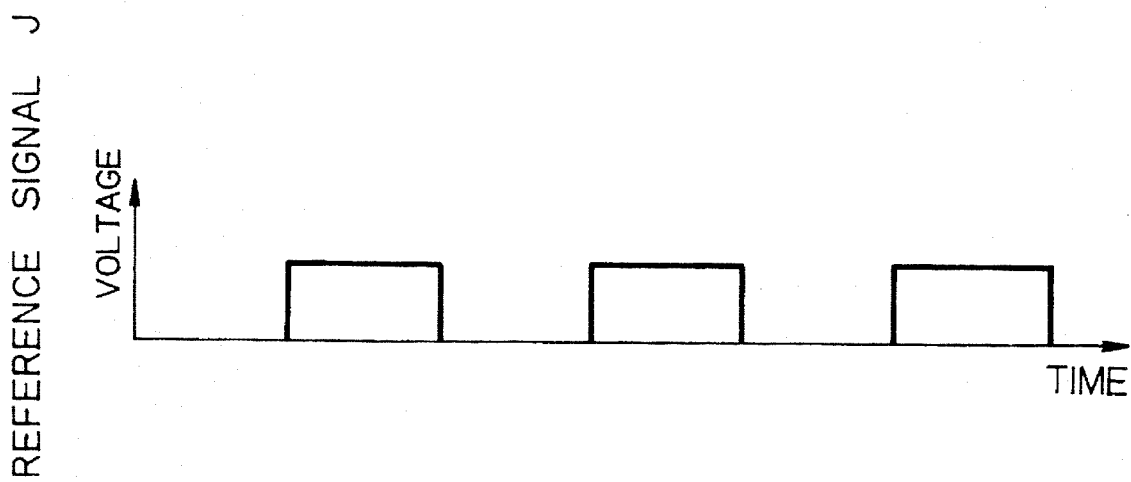

FIGS. 23A and 23B show signal waveforms of the reference signal A and the reference signal J, indicated in FIGS. 11 and 12.

As is indicated in FIGS. 23A and 23B, the reference signal A is inputted to the frequency divider 15 and is converted to a signal having half the frequency of the reference signal A and the thus converted signal is outputted as the reference signal J. The reference signal J is inputted to the phase comparison means 1.

As is clear from the above, according to the embodiment 6, it is possible to obtain a frequency synthesizer which not only has the same effects as the frequency synthesizer concerning the embodiment 1 but also is able to obtain an output signal by inputting a reference signal to the phase comparison means via the frequency divider instead of inputting the phase same to the comparison means as it is, the output signal being locked in phase with the reference signal and having a frequency which is equivalent to a divided frequency of the reference signal.

FIG. 12 is a block diagram showing a more specific constitution of FIG. 11.

In FIG. 12, the numeral 41 denotes a frequency divider.

Instead of inputting the reference signal A to the analog PD 42 as it is, a frequency of the reference signal A is divided by the frequency divider 41, whereby the reference signal J having a lower frequency is inputted to the analog phase comparator.

Thus, an output signal can be locked in phase with the reference signal, a frequency of which is equivalent to a divided frequency of the reference signal.

Embodiment 7

Hereinafter, embodiment 7 of a frequency synthesizer of the present invention will be explained by way of drawings.

Figure 13:
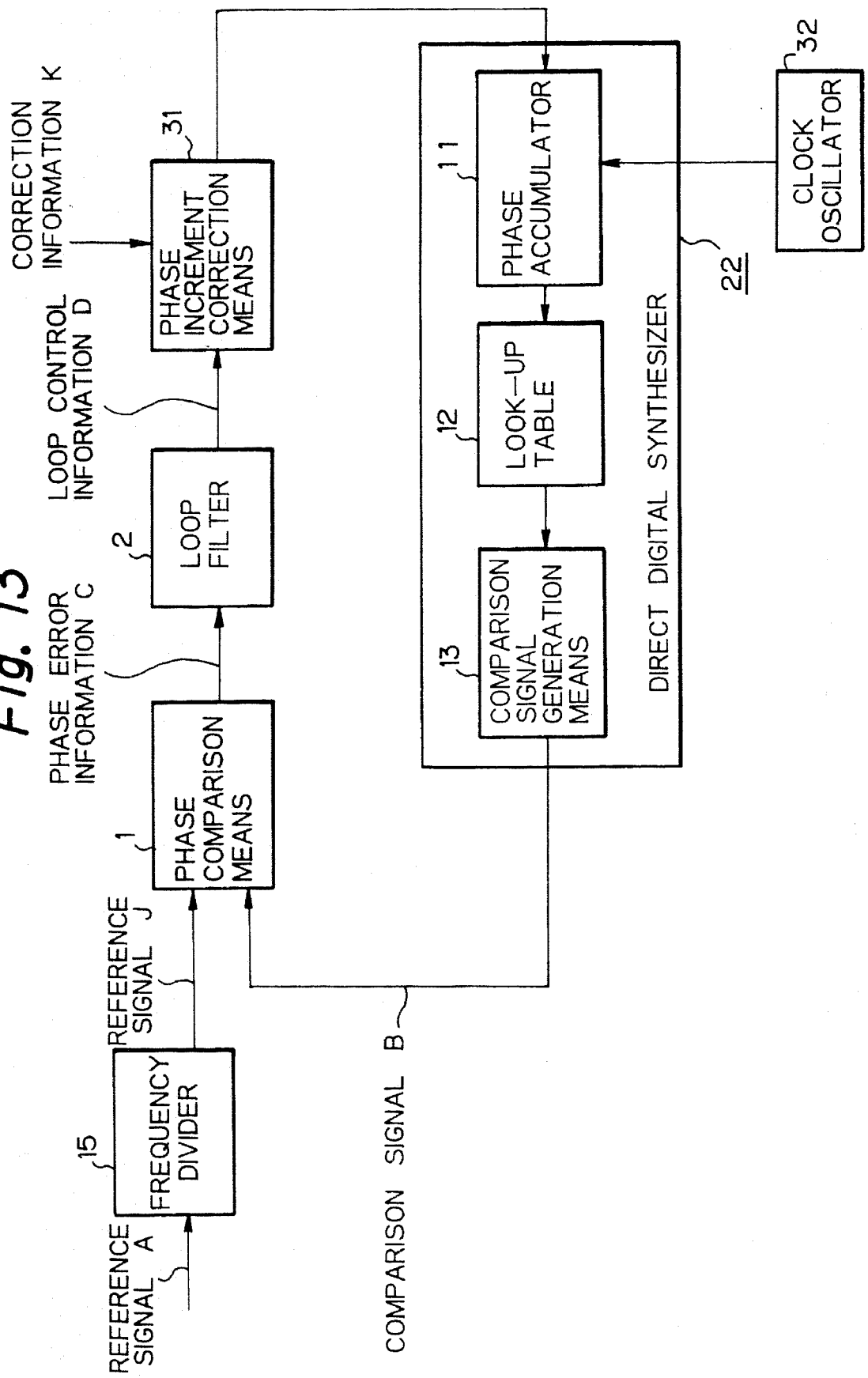
FIG. 13 is a block diagram illustrating the basic constitution of embodiment 7 of the present invention.
Figure 14:
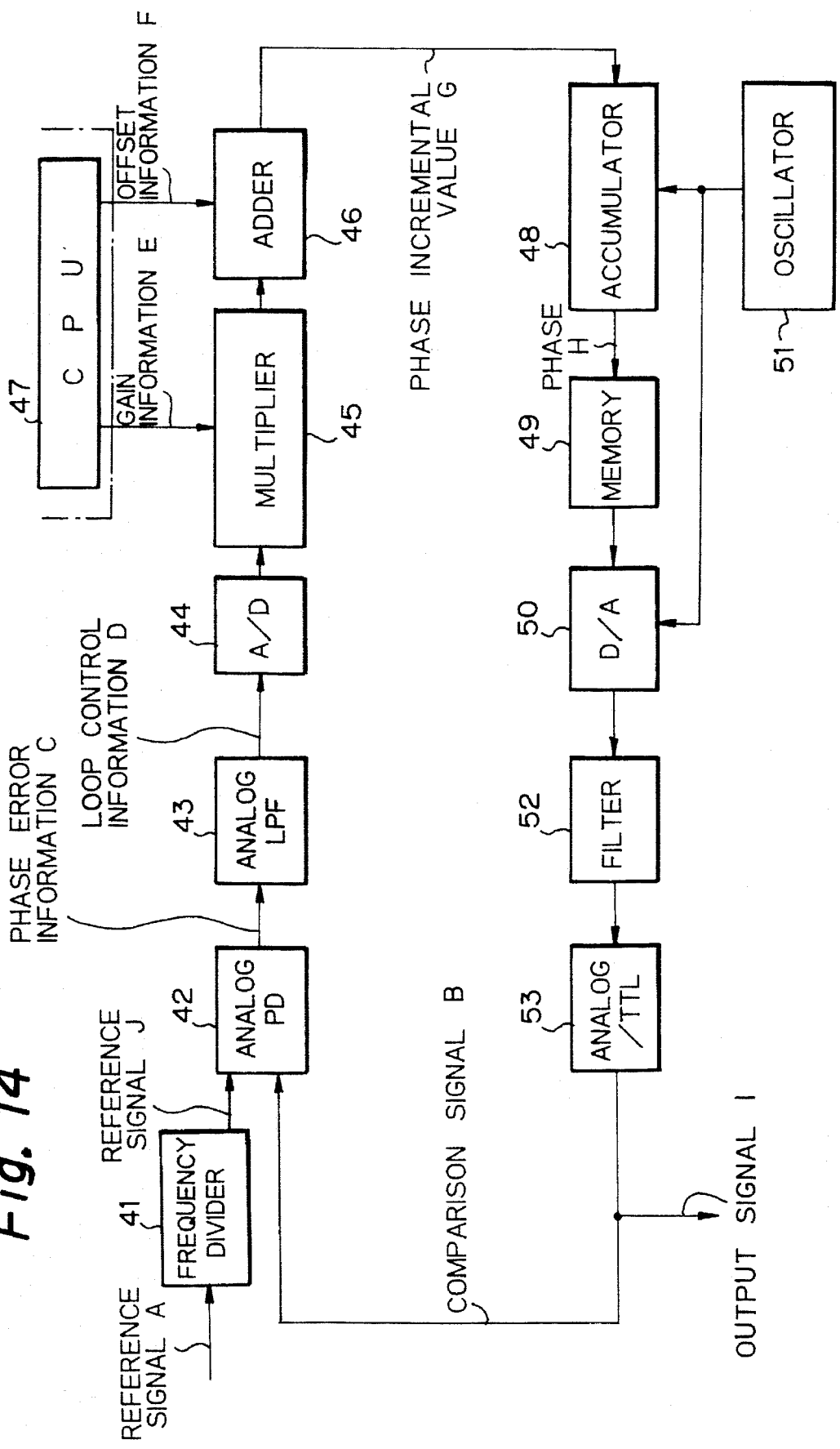
FIG. 14 is a block diagram showing a more specific constitution of the synthesizer indicated in FIG. 13.

FIG. 13 is a block diagram showing the basic constitution of the embodiment 7, whereas FIG. 14 is a block diagram showing a more specific constitution of the embodiment 7 indicated in FIG. 13.

The embodiment 7 is characterized in that the input stage of the reference signal A of the phase comparison means 1 comprising the phase-locked loop of the embodiment 2 is provided with the frequency divider 15, which divides a frequency of the reference signal A to obtain the reference signal J, and the thus obtained reference signal J is inputted to the phase comparison means 1.

The same components in the embodiments 2 and 7 are denoted by the same symbols and thus, an explanation about such components is omitted here.

Furthermore, when the phase comparison means consists of a digital circuit, the phase error information C and the loop control information D are also in a digital value. Therefore, such information fit the input of both the phase incremental correction means 31 and the phase accumulator 11.

Thus, according to the embodiment 7, it is possible to obtain a frequency synthesizer which not only has the same effects as the frequency synthesizer of the embodiment 2 but also is able to obtain an output signal which is locked in phase with a reference signal, a frequency of which is equivalent to a divided frequency of the reference signal, by inputting the reference signal to the phase comparison means via the frequency divider instead of inputting it directly to the phase comparison means as it is.

Embodiment 8

Hereinafter, embodiment 8 of a frequency synthesizer of the present invention will be explained by way of drawings.

Figure 15:
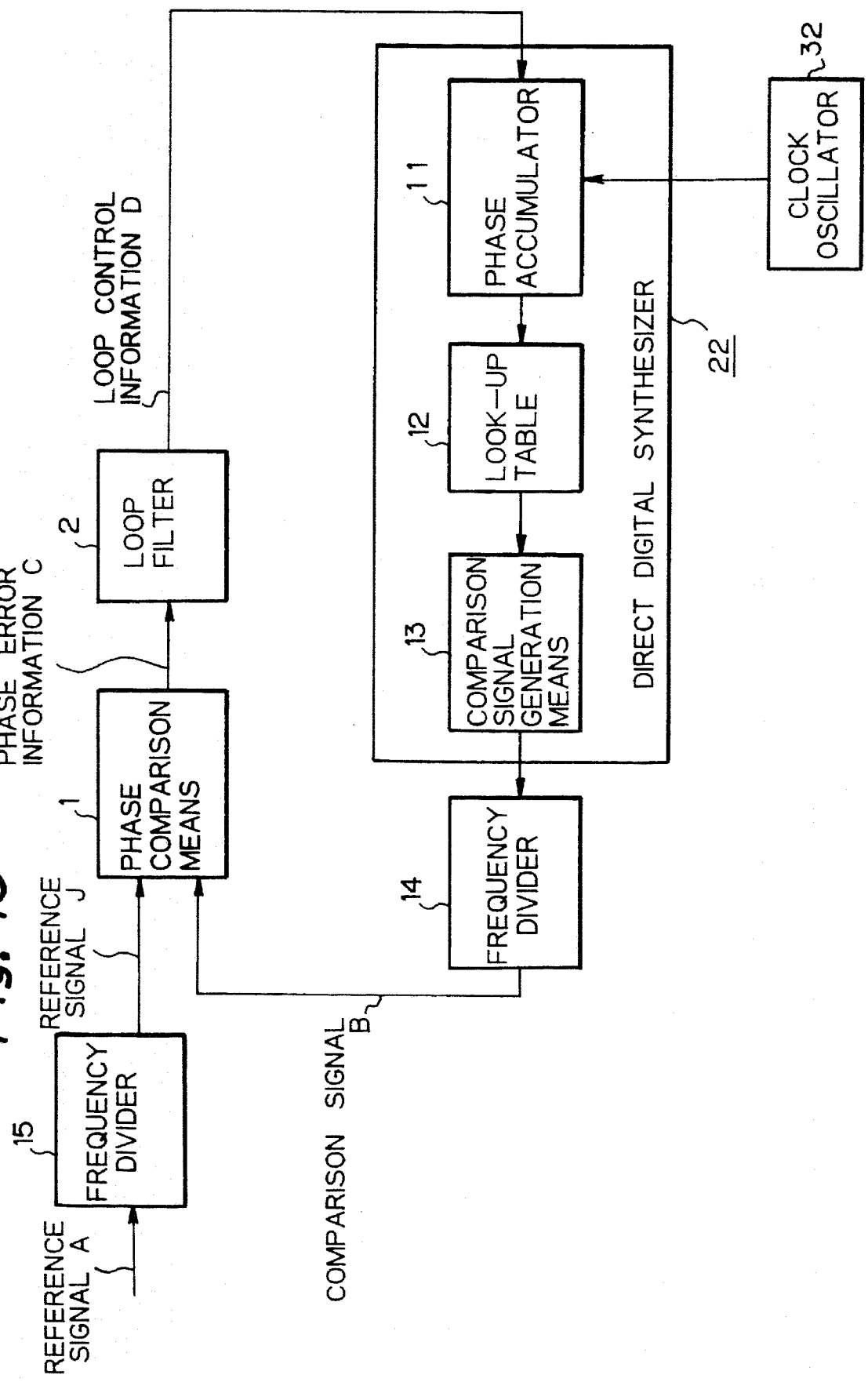
FIG. 15 is a block diagram illustrating the basic constitution of embodiment 8 of the present invention.
Figure 16:
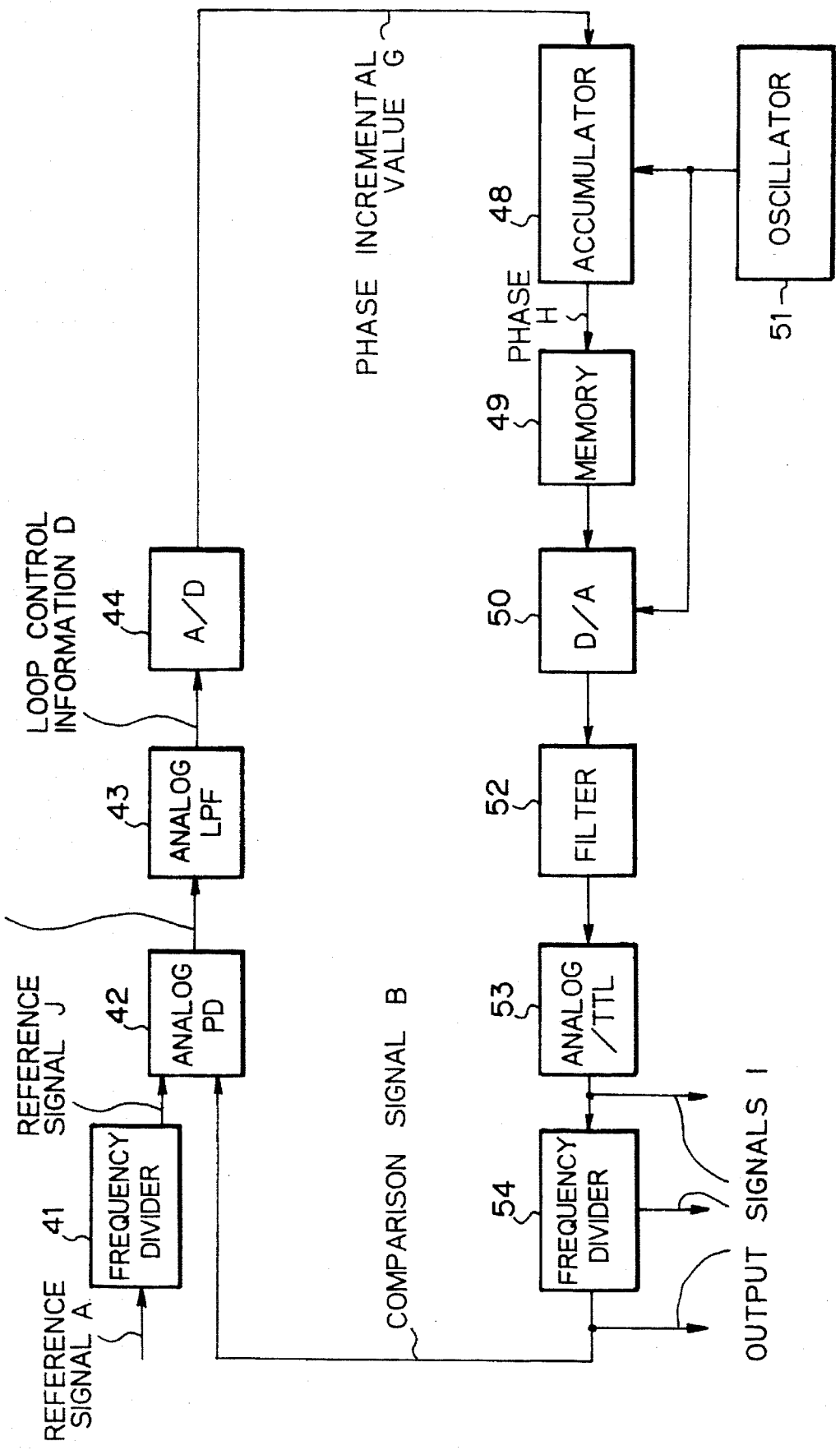
FIG. 16 is a block diagram showing a more specific constitution of the synthesizer indicated in FIG. 15.

FIG. 15 is a block diagram showing the basic constitution of the embodiment 8. FIG. 16 is a block diagram showing a more specific constitution of the embodiment described in FIG. 15.

The embodiment 8 is characterized in that the input stage of the reference signal A to be inputted to the phase comparison means 1 comprising the phase-locked loop of the embodiment 3 is provided with the frequency divider 15, whereby a frequency of the reference signal A is divided by the frequency divider 15 to obtain the reference signal J and the thus obtained reference signal J is inputted to the phase comparison means 1 as an input signal.

The same components in the embodiments 3 and 8 are denoted by the same symbols and therefore, an explanation about such components is omitted here.

Thus, according to the embodiment 8, it is possible to obtain the frequency synthesizer which not only has the same effects as the frequency synthesizer of the embodiment 3 but also is able to obtain an output signal which is locked in phase with a reference signal, a frequency of which is equivalent to a divided frequency of the reference signal, by inputting a reference signal to the phase comparison means via the frequency divider instead of inputting it directly to the phase comparison means as it is.

Embodiment 9

Hereinafter, embodiment 9 of a frequency synthesizer of the present invention will be explained by way of drawings.

Figure 17:
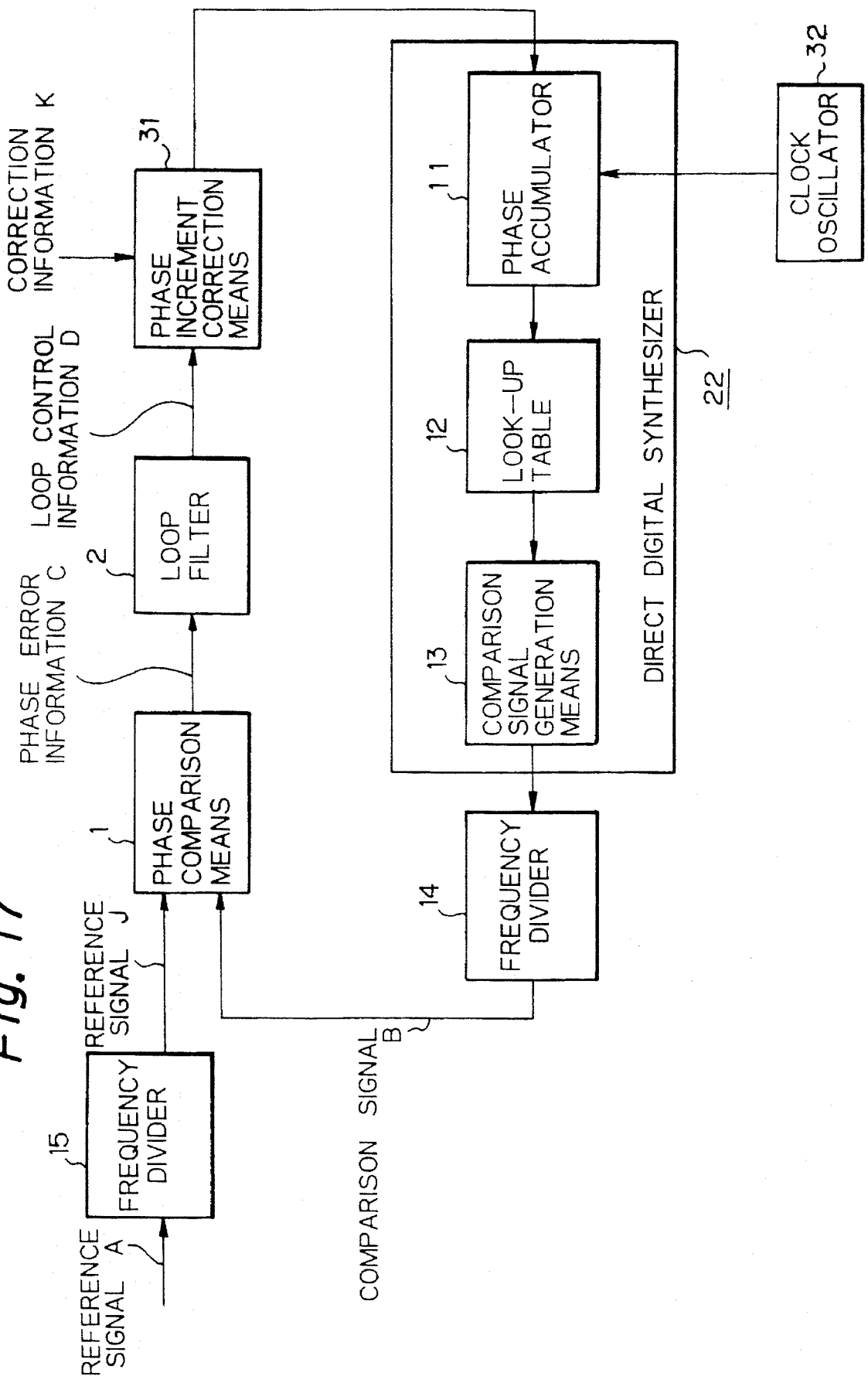
FIG. 17 is a block diagram illustrating the basic structure of embodiments 9 and 10 of the present invention in common.
Figure 18:
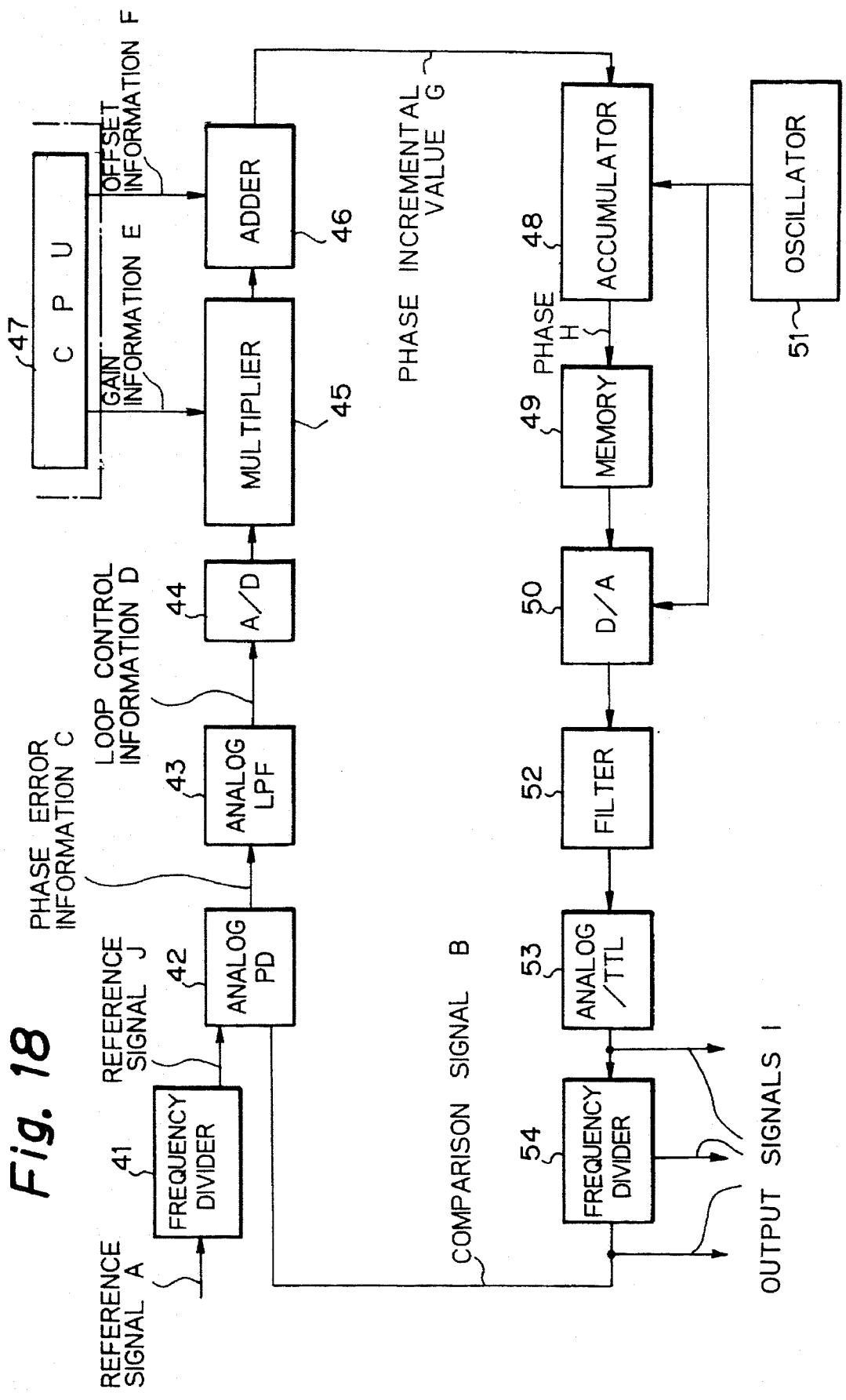
FIG. 18 is a block diagram showing a more specific constitution of the embodiment 9.

FIG. 17 is a block diagram showing the basic constitution of the embodiments 9 and 10. FIG. 18 is a block diagram showing a more specific constitution of the embodiment 9.

The embodiment 9 is characterized in that the input stage of the reference signal A to be inputted to the phase comparison means 1 comprising the phase-locked loop of the embodiment 4 is provided with the frequency divider 15, which divides a frequency of the reference signal A to obtain the reference signal J, and the thus obtained reference signal J is inputted to the phase comparison means 1 as an input signal.

The same components in the embodiments 4 and 9 are denoted by the same symbols-and therefore, an explanation about such components is omitted here.

In FIG. 17, a frequency of the reference signal A is divided by the frequency divider 15 and the thus obtained reference signal J is supplied to the phase comparison means 1.

Furthermore, when the phase comparison means consists of a digital circuit, the phase error information and the loop control information are usually in a digital value and therefore, such information fit the input of both the phase incremental correction means 31 and phase accumulator 11.

As is explained above, according to the embodiment 9, it is possible to obtain a frequency synthesizer which not only has the same effects as the frequency synthesizer of the embodiment 4 but also is able to obtain an output signal which is locked in phase with a reference signal, a frequency of which is equivalent to a divided frequency of the reference signal, by inputting a reference signal to the phase comparison means via the frequency divider instead of inputting it directly to the phase comparison means as it is.

Embodiment 10

Figure 19:
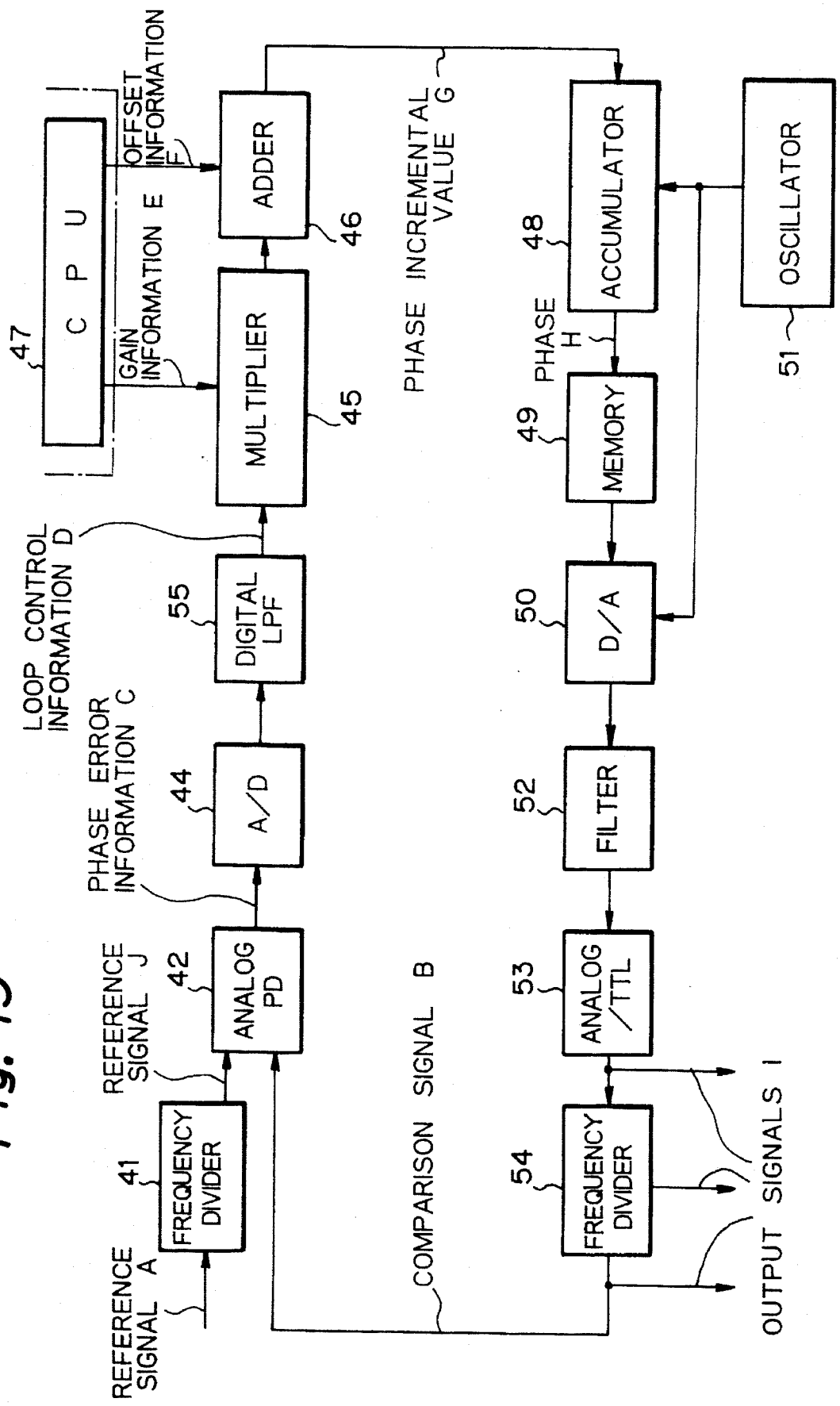
FIG. 19 is a block diagram showing a more specific constitution of the embodiment 10.

FIG. 19 is a block diagram showing a more specific constitution of the embodiment 10.

The embodiment 10 is characterized in that the digital LPF 55 in place of the analog LPF 43 of the embodiment 9 is provided. Thus, the LPF is digitalized, whereby it becomes possible to stabilize characteristics in relation to such problems with an analog LPF as dispersion of characteristics among the synthesizers and change in temperature or long-term use of the synthesizer and to obviate restrictions imposed in making a compact synthesizer.

It also indicates that it does not matter whether the loop control information D of the above constitution is an analog or digital signal.

As mentioned above, according to the invention set forth in the embodiment 1, the direct digital synthesizer employs as an input a phase incremental value which constitutes the loop control information to generate the comparison signal by using a clock from the outside of the loop and to further generate a synchronizing signal which follows a frequency of the reference signal, which is set to cover or varies over a broad range. It is also possible to obtain a frequency synthesizer which has stable phase-locked loop characteristics in relation to dispersion of characteristics among the synthesizers and change in temperature or long-term use thereof by eliminating the variable frequency oscillator of the loop.

As mentioned above, according to the invention set forth in the embodiment 2, it is possible to obtain a frequency synthesizer which not only has the same effects as those of the frequency synthesizer of the embodiment 1 but also is able to broaden or shift a follow-up range of the loop when the phase incremental correction means receives the gain/off-set information from the outside of the loop and the loop control information to thereby produce a phase incremental value.

As mentioned above, according to the invention set forth in the embodiment 3, it is possible to provide a frequency synthesizer which not only has the same effects as those of the frequency synthesizer of the embodiment 1 but also is able to obtain output signals locked in phase with a reference signal, frequencies of which are equivalent to an integral multiple of different divided frequencies of the reference signal, by turning an output signal from the direct digital synthesizer into a comparison signal via a frequency divider instead of turning the same into a comparison signal to be inputted to the phase comparison means as it is.

As is mentioned above, according to the invention set forth in the embodiments 4 and 5, it is possible to provide a frequency synthesizer which not only has the same effects as those of the frequency synthesizer of the embodiment 1 but also is able to broaden or shift a follow-up range of the loop when the phase incremental correction means receives the gain/off-set information from the outside of the loop and the loop control information to thereby produce a phase increment value and to obtain output signals locked in phase with a reference signal, frequencies of which are equivalent to an integral multiple of different divided frequencies of the reference signal, by turning an output signal from the direct digital synthesizer into a comparison signal via a frequency divider instead of turning the same into a comparison signal to be inputted to the phase comparison means as it is.

As is mentioned above, according to the invention of the embodiment 6 of the present invention, it is possible to provide a frequency synthesizer which not only has the same effects as those of the frequency synthesizer of the embodiment 1 but also is able to obtain an output signal locked in phase with a reference signal, a frequency of which is equivalent to a divided frequency of the reference signal, by inputting the reference signal to the phase comparison means via a frequency divider instead of inputting the same to the comparison means as it is.

As is mentioned above, according to the invention of the embodiment 7 of the present invention, it is possible to provide a frequency synthesizer which not only has the same effects as those of the frequency synthesizer of the embodiment 2 but also is able to obtain an output signal locked in phase with a reference signal, a frequency of which is equivalent to a divided frequency of the reference signal, by inputting the reference signal to the phase comparison means via a frequency divider instead of inputting the same to the comparison means as it is.

As is mentioned above, according to the invention of the embodiment 8 of the present invention, it is possible to provide a frequency synthesizer which not only has the same effects as those of the frequency synthesizer of the embodiment 3 but also is able to obtain an output signal locked in phase with a reference signal, a frequency of which is equivalent to a divided frequency of the reference signal, by inputting the reference signal to the phase comparison means via the frequency divider instead of inputting the same to the comparison means as it is.

As is mentioned above, according to the invention of the embodiments 9 and 10, it is possible to provide a frequency synthesizer which not only has the same effects as those of the frequency synthesizer of the embodiments 4 and 5 but also is able to obtain an output signal locked in phase with a reference signal, a frequency of which is equivalent to a divided frequency of the reference signal, by inputting the reference signal to the phase comparison means via a frequency divider instead of inputting the same to the comparison means as it is.

What is claimed is:

1. A frequency synthesizer with a direct digital synthesizer being incorporated inside a phase-locked loop comprising:

(a) phase comparison means which detects a phase difference between a reference signal and a comparison signal to output phase error information having a sign and magnitude of the phase error, (b) a loop filter which generates loop control information having a sign and magnitude for controlling the loop in accordance with said phase error information, (c) said direct digital synthesizer which generates said comparison signal by employing a clock signal from outside of said phase-locked loop, in accordance with said loop control information which is a phase incremental value being used as an input; and (d) phase increment correction means which receives said loop control information and which also receives correction information in the form of gain information and offset information from outside of said loop to thereby produce said phase incremental value in response to said loop control information and said correction information, whereby a synchronizing signal which follows the frequency of said reference signal that varies over a broad range is generated.

2. A frequency synthesizer according to claim 1 characterized by having a frequency divider on the input stage of the reference signal to be inputted to said phase comparison means.

* * * * *